(12) United States Patent
Dyer

(10) Patent No.: US 12,451,864 B2
(45) Date of Patent: Oct. 21, 2025

(54) TRANSVERSELY-EXCITED FILM BULK ACOUSTIC RESONATORS WITH CURVED SHAPED ENDS OF FINGERS OR OPPOSING BUSBARS

(71) Applicant: Murata Manufacturing Co., Ltd., Nagaokakyo (JP)

(72) Inventor: Greg Dyer, Santa Barbara, CA (US)

(73) Assignee: Murata Manufacturing Co., Ltd., Nagaokakyo (JP)

( * ) Notice: Subject to any disclaimer, the term of this patent is extended or adjusted under 35 U.S.C. 154(b) by 450 days.

(21) Appl. No.: 17/956,132

(22) Filed: Sep. 29, 2022

(65) Prior Publication Data

US 2023/0111410 A1 Apr. 13, 2023

Related U.S. Application Data

(60) Provisional application No. 63/249,575, filed on Sep. 29, 2021.

(51) Int. Cl.
*H03H 9/205* (2006.01)
*H03H 9/02* (2006.01)
*H03H 9/56* (2006.01)

(52) U.S. Cl.
CPC ........ *H03H 9/205* (2013.01); *H03H 9/02015* (2013.01); *H03H 9/02228* (2013.01); *H03H 9/568* (2013.01)

(58) Field of Classification Search
CPC ............... H03H 9/205; H03H 9/02015; H03H 9/02228; H03H 9/568; H03H 3/02;
(Continued)

(56) References Cited

U.S. PATENT DOCUMENTS

| 5,189,777 A | 3/1993 | Guckel et al. |
| 5,204,575 A | 4/1993 | Kanda et al. |

(Continued)

FOREIGN PATENT DOCUMENTS

| CN | 209017001 A | 6/2019 |
| CN | 112787614 A | 5/2021 |

(Continued)

OTHER PUBLICATIONS

A. C. Guyette, "Theory and Design of Intrinsically Switched Multiplexers With Optimum Phase Linearity," in IEEE Transactions on Microwave Theory and Techniques, vol. 61, No. 9, pp. 3254-3264, Sep. 2013, doi: 10.1109/TMTT.2013.2274963. Sep. 2013.

(Continued)

*Primary Examiner* — Jorge L Salazar, Jr.
(74) *Attorney, Agent, or Firm* — ArentFox Schiff LLP

(57) ABSTRACT

An acoustic resonator has a substrate having a surface and a single-crystal piezoelectric plate, with a portion of the piezoelectric plate forming a diaphragm that spans a cavity in the substrate. An interdigital transducer (IDT) is formed on a surface of the single-crystal piezoelectric plate such that interleaved fingers of the IDT are disposed on the diaphragm. The ends of IDT interleaved fingers or inner surfaces of the opposing busbars have a curved shape. In some cases, gaps between ends of the interleaved fingers and opposing busbars have one of circular gap shapes or parabolic gap shapes. The cavity may be formed in an intermediate layer of the substrate.

20 Claims, 9 Drawing Sheets

(58) Field of Classification Search
CPC ....... H03H 2003/021; H03H 2003/023; H03H 9/02157; H03H 9/132; H03H 9/173; H03H 9/174
USPC .................. 333/133, 186–188, 193–196
See application file for complete search history.

(56) References Cited

U.S. PATENT DOCUMENTS

| | | | |
|---|---|---|---|
| 5,274,345 A | 12/1993 | Gau | |
| 5,446,330 A | 8/1995 | Eda et al. | |
| 5,552,655 A | 9/1996 | Stokes et al. | |
| 5,726,610 A | 3/1998 | Allen et al. | |
| 5,729,186 A | 3/1998 | Seki et al. | |
| 5,853,601 A | 12/1998 | Krishaswamy | |
| 5,952,899 A | 9/1999 | Kadota et al. | |
| 6,172,582 B1 | 1/2001 | Hickernell | |
| 6,271,617 B1 | 8/2001 | Yoneda et al. | |
| 6,377,140 B1 | 4/2002 | Ehara et al. | |
| 6,516,503 B1 | 2/2003 | Ikada et al. | |
| 6,540,827 B1 | 4/2003 | Levy et al. | |
| 6,570,470 B2 | 5/2003 | Maehara et al. | |
| 6,707,229 B1 | 3/2004 | Martin | |
| 6,710,514 B2 | 3/2004 | Kada et al. | |
| 6,791,236 B1 * | 9/2004 | Abramov | H03H 9/14517 310/313 C |
| 6,833,774 B2 | 12/2004 | Abbott et al. | |
| 7,009,468 B2 | 3/2006 | Kadota et al. | |
| 7,345,400 B2 | 3/2008 | Nakao et al. | |
| 7,463,118 B2 | 12/2008 | Jacobsen | |
| 7,535,152 B2 | 5/2009 | Ogami et al. | |
| 7,684,109 B2 | 3/2010 | Godshalk et al. | |
| 7,728,483 B2 | 6/2010 | Tanaka | |
| 7,868,519 B2 | 1/2011 | Umeda | |
| 7,941,103 B2 | 5/2011 | Iwamoto et al. | |
| 7,965,015 B2 | 6/2011 | Tai et al. | |
| 8,278,802 B1 | 10/2012 | Lee et al. | |
| 8,294,330 B1 | 10/2012 | Abbott et al. | |
| 8,344,815 B2 | 1/2013 | Yamanaka et al. | |
| 8,816,567 B2 | 8/2014 | Zuo et al. | |
| 8,829,766 B2 | 9/2014 | Milyutin et al. | |
| 8,932,686 B2 | 1/2015 | Hayakawa et al. | |
| 9,093,979 B2 | 7/2015 | Wang | |
| 9,112,134 B2 | 8/2015 | Takahashi | |
| 9,130,145 B2 | 9/2015 | Martin et al. | |
| 9,148,121 B2 | 9/2015 | Inoue | |
| 9,219,466 B2 | 12/2015 | Meltaus et al. | |
| 9,276,557 B1 | 3/2016 | Nordquist et al. | |
| 9,369,105 B1 | 6/2016 | Li et al. | |
| 9,425,765 B2 | 8/2016 | Rinaldi | |
| 9,525,398 B1 | 12/2016 | Olsson | |
| 9,640,750 B2 | 5/2017 | Nakanishi et al. | |
| 9,748,923 B2 | 8/2017 | Kando et al. | |
| 9,762,202 B2 | 9/2017 | Thalmayr et al. | |
| 9,780,759 B2 | 10/2017 | Kimura et al. | |
| 9,837,984 B2 | 12/2017 | Khlat et al. | |
| 10,079,414 B2 | 9/2018 | Guyette et al. | |
| 10,187,039 B2 | 1/2019 | Komatsu et al. | |
| 10,200,013 B2 | 2/2019 | Bower et al. | |
| 10,211,806 B2 | 2/2019 | Bhattacharjee | |
| 10,284,176 B1 | 5/2019 | Solal | |
| 10,389,332 B2 | 8/2019 | Bhattacharjee | |
| 10,476,469 B2 | 11/2019 | Gong et al. | |
| 10,491,192 B1 | 11/2019 | Plesski et al. | |
| 10,601,392 B2 | 3/2020 | Plesski et al. | |
| 10,637,438 B2 | 4/2020 | Garcia et al. | |
| 10,644,674 B2 | 5/2020 | Takamine | |
| 10,756,697 B2 | 8/2020 | Plesski et al. | |
| 10,790,802 B2 | 9/2020 | Yantchev et al. | |
| 10,797,675 B2 | 10/2020 | Plesski | |
| 10,812,048 B2 | 10/2020 | Nosaka | |
| 10,819,309 B1 | 10/2020 | Turner et al. | |
| 10,826,462 B2 | 11/2020 | Plesski et al. | |
| 10,868,510 B2 | 12/2020 | Yantchev et al. | |
| 10,868,512 B2 | 12/2020 | Garcia et al. | |
| 10,868,513 B2 | 12/2020 | Yantchev | |
| 10,911,017 B2 | 2/2021 | Plesski | |
| 10,911,021 B2 | 2/2021 | Turner et al. | |
| 10,911,023 B2 | 2/2021 | Turner | |
| 10,917,070 B2 | 2/2021 | Plesski et al. | |
| 10,917,072 B2 | 2/2021 | McHugh et al. | |
| 10,985,726 B2 | 4/2021 | Plesski | |
| 10,985,728 B2 | 4/2021 | Plesski et al. | |
| 10,985,730 B2 | 4/2021 | Garcia | |
| 10,992,282 B1 | 4/2021 | Plesski et al. | |
| 10,992,283 B2 | 4/2021 | Plesski et al. | |
| 10,992,284 B2 | 4/2021 | Yantchev | |
| 10,998,877 B2 | 5/2021 | Turner et al. | |
| 10,998,882 B2 | 5/2021 | Yantchev et al. | |
| 11,003,971 B2 | 5/2021 | Plesski et al. | |
| 11,114,996 B2 | 9/2021 | Plesski et al. | |
| 11,114,998 B2 | 9/2021 | Garcia et al. | |
| 11,139,794 B2 | 10/2021 | Plesski et al. | |
| 11,143,561 B2 | 10/2021 | Plesski | |
| 11,146,231 B2 | 10/2021 | Plesski | |
| 11,146,232 B2 | 10/2021 | Yandrapalli et al. | |
| 11,146,238 B2 | 10/2021 | Hammond et al. | |
| 11,146,244 B2 | 10/2021 | Yantchev | |
| 11,165,407 B2 | 11/2021 | Yantchev | |
| 11,171,629 B2 | 11/2021 | Turner | |
| 11,201,601 B2 | 12/2021 | Yantchev et al. | |
| 11,206,009 B2 | 12/2021 | Plesski | |
| 11,228,296 B2 | 1/2022 | Dyer | |
| 11,239,816 B1 | 2/2022 | Mchugh | |
| 11,239,822 B2 | 2/2022 | Garcia | |
| 11,264,966 B2 | 3/2022 | Yantchev | |
| 11,264,969 B1 | 3/2022 | Fenzi | |
| 11,271,539 B1 | 3/2022 | Yantchev | |
| 11,271,540 B1 | 3/2022 | Yantchev | |
| 11,283,424 B2 | 3/2022 | Turner | |
| 11,309,865 B1 | 4/2022 | Guyette | |
| 11,323,089 B2 | 5/2022 | Turner | |
| 11,323,090 B2 | 5/2022 | Garcia | |
| 11,323,091 B2 | 5/2022 | Kay | |
| 11,323,095 B2 | 5/2022 | Garcia | |
| 11,323,096 B2 | 5/2022 | Yantchev | |
| 11,349,450 B2 | 5/2022 | Yantchev | |
| 11,349,452 B2 | 5/2022 | Yantchev | |
| 11,356,077 B2 | 6/2022 | Garcia | |
| 11,368,139 B2 | 6/2022 | Garcia | |
| 11,374,549 B2 | 6/2022 | Yantchev | |
| 11,381,221 B2 | 7/2022 | McHugh | |
| 2002/0079986 A1 | 6/2002 | Ruby et al. | |
| 2002/0130736 A1 | 9/2002 | Mukai | |
| 2002/0153970 A1 | 10/2002 | Noto | |
| 2002/0158714 A1 | 10/2002 | Kaitila et al. | |
| 2002/0189062 A1 | 12/2002 | Lin et al. | |
| 2002/0190814 A1 | 12/2002 | Yamada et al. | |
| 2003/0042998 A1 | 3/2003 | Edmonson | |
| 2003/0080831 A1 | 5/2003 | Naumenko et al. | |
| 2003/0199105 A1 | 10/2003 | Kub et al. | |
| 2004/0041496 A1 | 3/2004 | Imai et al. | |
| 2004/0100164 A1 | 5/2004 | Murata | |
| 2004/0130410 A1 | 7/2004 | Nishimura et al. | |
| 2004/0140866 A1 | 7/2004 | Taniguchi | |
| 2004/0233020 A1 | 11/2004 | Nakamura | |
| 2004/0261250 A1 | 12/2004 | Kadota et al. | |
| 2005/0077982 A1 | 4/2005 | Funasaka | |
| 2005/0185026 A1 | 8/2005 | Noguchi et al. | |
| 2005/0218488 A1 | 10/2005 | Matsuo | |
| 2005/0264136 A1 | 12/2005 | Tsutsumi et al. | |
| 2006/0055485 A1 | 3/2006 | Lobeek | |
| 2006/0152107 A1 | 7/2006 | Tanaka | |
| 2006/0179642 A1 | 8/2006 | Kawamura | |
| 2007/0029679 A1 | 2/2007 | Selmeier et al. | |
| 2007/0030096 A1 | 2/2007 | Nichihara et al. | |
| 2007/0182510 A1 | 8/2007 | Park | |
| 2007/0188047 A1 | 8/2007 | Tanaka | |
| 2007/0194863 A1 | 8/2007 | Shibata et al. | |
| 2007/0267942 A1 | 11/2007 | Matsumoto et al. | |
| 2008/0100397 A1 | 5/2008 | Nam et al. | |
| 2008/0246559 A1 | 10/2008 | Ayazi | |
| 2009/0114798 A1 | 5/2009 | Tigli et al. | |
| 2010/0019866 A1 | 1/2010 | Hara et al. | |
| 2010/0064492 A1 | 3/2010 | Tanaka | |

(56) References Cited

U.S. PATENT DOCUMENTS

| | | |
|---|---|---|
| 2010/0117483 A1 | 5/2010 | Tanaka |
| 2010/0123367 A1 | 5/2010 | Tai et al. |
| 2011/0018389 A1 | 1/2011 | Fukano et al. |
| 2011/0018654 A1 | 1/2011 | Bradley et al. |
| 2011/0109196 A1 | 5/2011 | Goto et al. |
| 2011/0254406 A1 | 10/2011 | Yamane |
| 2011/0278993 A1 | 11/2011 | Iwamoto |
| 2012/0073390 A1 | 3/2012 | Zaghloul et al. |
| 2012/0198672 A1 | 8/2012 | Jeda et al. |
| 2012/0286900 A1 | 11/2012 | Kadota et al. |
| 2012/0326809 A1 | 12/2012 | Tsuda |
| 2013/0127551 A1 | 5/2013 | Yamanaka |
| 2013/0234805 A1 | 9/2013 | Takahashi |
| 2013/0271238 A1 | 10/2013 | Onda |
| 2013/0278609 A1 | 10/2013 | Stephanou et al. |
| 2013/0300519 A1 | 11/2013 | Tamasaki et al. |
| 2013/0321100 A1 | 12/2013 | Wang |
| 2014/0009032 A1 | 1/2014 | Takahashi |
| 2014/0015624 A1 | 1/2014 | Kishino |
| 2014/0130319 A1 | 5/2014 | Iwamoto |
| 2014/0145556 A1 | 5/2014 | Kadota |
| 2014/0151151 A1 | 6/2014 | Reinhardt |
| 2014/0152145 A1 | 6/2014 | Kando et al. |
| 2014/0173862 A1 | 6/2014 | Kando et al. |
| 2014/0225684 A1 | 8/2014 | Kando et al. |
| 2014/0340173 A1 | 11/2014 | Burgener et al. |
| 2015/0014795 A1 | 1/2015 | Franosch |
| 2015/0042417 A1 | 2/2015 | Onodera et al. |
| 2015/0165479 A1 | 6/2015 | Lasiter et al. |
| 2015/0319537 A1 | 11/2015 | Perois et al. |
| 2015/0333730 A1 | 11/2015 | Meltaus et al. |
| 2015/0365067 A1 | 12/2015 | Hori et al. |
| 2016/0028367 A1 | 1/2016 | Shealy |
| 2016/0087187 A1 | 3/2016 | Burak |
| 2016/0182009 A1 | 6/2016 | Bhattacharjee |
| 2016/0261038 A1 | 9/2016 | Tanaka |
| 2017/0063332 A1 | 3/2017 | Gilbert et al. |
| 2017/0155373 A1 | 6/2017 | Ruby |
| 2017/0179225 A1 | 6/2017 | Kishimoto |
| 2017/0179928 A1 | 6/2017 | Raihn et al. |
| 2017/0201235 A1 | 7/2017 | Freisleben |
| 2017/0214381 A1 | 7/2017 | Bhattacharjee |
| 2017/0214387 A1 | 7/2017 | Burak et al. |
| 2017/0222617 A1 | 8/2017 | Mizoguchi |
| 2017/0222622 A1 | 8/2017 | Solal et al. |
| 2017/0370791 A1 | 12/2017 | Nakamura et al. |
| 2018/0005950 A1 | 1/2018 | Watanabe |
| 2018/0026603 A1 | 1/2018 | Iwamoto |
| 2018/0033952 A1 | 2/2018 | Yamamoto |
| 2018/0041191 A1 | 2/2018 | Park |
| 2018/0062615 A1 | 3/2018 | Kato et al. |
| 2018/0062617 A1 | 3/2018 | Yun et al. |
| 2018/0123016 A1 | 5/2018 | Gong |
| 2018/0191322 A1 | 7/2018 | Chang et al. |
| 2018/0262179 A1 | 9/2018 | Goto |
| 2018/0278227 A1 | 9/2018 | Hurwitz |
| 2018/0309426 A1 | 10/2018 | Guenard |
| 2018/0369816 A1 | 12/2018 | Ai et al. |
| 2019/0044498 A1 | 2/2019 | Kawasaki |
| 2019/0068164 A1 | 2/2019 | Houlden et al. |
| 2019/0123721 A1 | 4/2019 | Takamine |
| 2019/0131953 A1 | 5/2019 | Gong |
| 2019/0181832 A1 | 6/2019 | Schmalzl et al. |
| 2019/0190487 A1 | 6/2019 | Yasuda |
| 2019/0245509 A1 | 8/2019 | Hurwitz |
| 2019/0253038 A1 | 8/2019 | Houlden |
| 2019/0273480 A1 | 9/2019 | Lin et al. |
| 2019/0348966 A1 | 11/2019 | Campanella-Pineda |
| 2019/0379351 A1 | 12/2019 | Miyamoto et al. |
| 2019/0386635 A1 | 12/2019 | Plesski et al. |
| 2019/0386636 A1 | 12/2019 | Plesski et al. |
| 2020/0007110 A1 | 1/2020 | Konaka et al. |
| 2020/0021271 A1 | 1/2020 | Plesski |
| 2020/0021272 A1 | 1/2020 | Segovia Fernandez et al. |
| 2020/0028481 A1 | 1/2020 | Sun et al. |
| 2020/0028489 A1 | 1/2020 | Ta et al. |
| 2020/0036357 A1 | 1/2020 | Mimura |
| 2020/0083861 A1 | 3/2020 | Matsuo |
| 2020/0083862 A1 | 3/2020 | Makkonen et al. |
| 2020/0083863 A1 | 3/2020 | Makkonen et al. |
| 2020/0153412 A1 | 5/2020 | Nosaka |
| 2020/0177160 A1 | 6/2020 | Jachowski |
| 2020/0235719 A1 | 7/2020 | Yantchev et al. |
| 2020/0259480 A1 | 8/2020 | Pensala |
| 2020/0274520 A1 | 8/2020 | Shin |
| 2020/0313645 A1 | 10/2020 | Caron |
| 2020/0328725 A1 | 10/2020 | Jo et al. |
| 2020/0350891 A1 | 11/2020 | Turner |
| 2021/0006229 A1 | 1/2021 | Yantchev |
| 2021/0013859 A1 | 1/2021 | Turner et al. |
| 2021/0013860 A1 | 1/2021 | Dyer et al. |
| 2021/0067138 A1 | 3/2021 | Yantchev |
| 2021/0091749 A1 | 3/2021 | Plesski et al. |
| 2021/0119595 A1 | 4/2021 | Turner et al. |
| 2021/0126624 A1 | 4/2021 | Hiramatsu et al. |
| 2021/0152154 A1 | 5/2021 | Tang |
| 2021/0265978 A1 | 8/2021 | Plesski et al. |
| 2021/0328574 A1 | 10/2021 | Garcia |
| 2021/0351762 A1 | 11/2021 | Dyer et al. |
| 2021/0399750 A1 | 12/2021 | Varela Campelo |
| 2022/0067138 A1 | 3/2022 | Paert |

FOREIGN PATENT DOCUMENTS

| | | |
|---|---|---|
| CN | 113839643 A | 12/2021 |
| GB | 2578958 A | 6/2020 |
| JP | 2020155967 A | 9/2020 |
| WO | 2016017104 | 2/2016 |
| WO | 2018003273 | 1/2018 |

OTHER PUBLICATIONS

Acoustic Properties of Solids ONDA Corporation 592 Weddell Drive, Sunnyvale, CA 94089, Apr. 11, 2003, pp. 5 (Year 2003). 2003.

Bahreyni, B. Fabrication and Design of Resonant Microdevices Andrew William, Inc. 2018, NY (Year 2008). 2008.

Bai et al. "The Simulation of Resonant Mode and Effective Electromechanical Coupling Coefficient of Lithium Niobate Crystal with Different Orientations", J. Phys.: Conf. Ser. 1637 012064, 2020 (Year: 2020).

Buchanan "Ceramic Materials for Electronics" 3rd Edition, first published in 2004 by Marcel Dekker, Inc. pp. 496 (Year 2004). Jan. 2004.

Ekeom, D. & Dubus, Bertrand & Volatier, A . . . (2006). Solidly mounted resonator (SMR) FEM-BEM simulation. 1474-1477. 10.1109/ULTSYM.2006.371.

G. Manohar, "Investigation of Various Surface Acoustic Wave Design Configurations for Improved Sensitivity." Doctoral dissertation, University of South Florida, USA, Jan. 2012, 7 pages.

Gnewuch, et al. "Broadband monolithic acousto-optic tunable filter", Mar. 1, 2000 / vol. 25, No. 5 / Optics Letters (Year: 2000).

Kadota et al. "5.4 Ghz Lamb Wave Resonator on LiNbO3 Thin Crystal Plate and Its Application," published in Japanese Journal of Applied Physics 50 (2011) 07HD11. (Year: 2011) 2011.

Kadota et al., "Ultra-Wideband Ladder Filter Using SH0 Plate Wave in Thin LiNbO3 Plate and Its Application to Tunable Filter", IEEE Transactions on Ultrasonics, Ferroelectrics, and Frequency Control, vol. 62, No. 5, May 2015, pp. 939-946 (Year: 2015).

Lin et al., "A novel weighted method for layered SAW filters using slanted finger interdigital transducers", J. Phys. D: Appl. Phys. 39 (2006) pp. 466-470 (Year: 2006).

M. Kadota et al.; "Ultrawide Band Ladder Filter using SH0 plate Wave in Thin LiNbO3 Plate and its Application"; 2014 IEEE International Ultrasonics Symposium Proceedings, 2014, pp. 2031-2034. (Year: 2014).

M. Kadota, S. Tanaka, "Wideband acoustic wave resonators composed of hetero acoustic layer structure," Japanese Journal of Applied Physics, vol. 57, No. 7S1. Published Jun. 5, 2018. 5 pages.

(56) References Cited

OTHER PUBLICATIONS

M.-H. Li et al.; "Temperature Stability Analysis of Thin-Film Lithium Niobate SH0 Plate Wave Resonators"; Journal of Microelectromechanical Systems, vol. 28, No. 5, Oct. 2019, pp. 799-809. (Year: 2019).

Material Properties of Tibtech Innovations, © 2018 Tibtech Innovations (Year 2018). 2018.

Merriam Webster, dictionary meaning of the word "diaphragm", since 1828, Merriam Webster (Year: 1828) 1828.

Mizutaui, K. and Toda, K., "Analysis of lamb wave propagation characteristics in rotated Ycut Xpropagation LiNbO3 plates." Electron. Comm. Jpn. Pt. I, 69, No. 4 (1986): 47-55. doi:10.1002/ecja.4410690406.

Moussa et al. Review on Triggered Liposomal Drug Delivery with a Focus on Ultrasound 2015, Bentham Science Publishers, pp. 16 (Year 2005) 2005.

Namdeo et al. "Simulation on Effects of Electrical Loading due to Interdigital Transducers in Surface Acoustic Wave Resonator", published in Procedia Engineering 64 ( 2013) of Science Direct pp. 322-330 (Year: 2013) 2013.

Naumenko et al., "Optimal orientations of Lithium Niobate for resonator SAW filters", 2003 IEEE Ultrasonics Symposium—pp. 2110-2113. (Year: 2003).

R. Olsson III, K. Hattar et al. "A high electromechanical coupling coefficient SH0 Lamb wave lithiumniobate micromechanical resonator and a method for fabrication" Sensors and Actuators A: Physical, vol. 209, Mar. 1, 2014, pp. 183-190.

Reinhardt, "Acoustic filters based on thin single crystal LiNbQ,3 films: status and prospects", 2014 IEEE International Ultrasonics Symposium Proceedings, pp. 773-781 (Year: 2014).

Rodriguez-Madrid et al., "Super-High-Frequency SAW Resonators on AlN/Diamond", IEEE Electron Device Letters, vol. 33, No. 4, Apr. 2012, pp. 495-497. Year: 2012) 2012.

Safari et al. "Piezoelectric for Transducer Applications" published by Elsevier Science Ltd., pp. 4 (Year: 2000). 2020.

Santosh, G. , Surface acoustic wave devices on silicon using patterned and thin film ZnO, Ph.D. thesis, Feb. 2016, Indian Institute of technology Guwahati, Assam, India Feb. 2016.

Sinha et al., "Slanted finger Inter-digital Transducers for the design of improved performance small shape factor mid-bandwidth SAW filters", IEEE MTT-S International Microwave and RF Conference, 2013. (Year: 2013).

Sorokin et al. Study of Microwave Acoustic Attenuation in a Multi-frequency Bulk Acoustic Resonator Based on a Synthetic Diamond Single Crystal Published in Acoustical Physics, vol. 61, No. 6, 2015 p. 675 (Year 2015) Jan. 2015.

T. Takai, H. Iwamoto, et al., "I.H.P.Saw Technology and its Application to Microacoustic Components (Invited)." 2017 IEEE International Ultrasonics Symposium, Sep. 6-9, 2017. pp. 1-8.

USPTO/ISA, International Search Report and Written Opinion for PCT Application No. PCT/US2019/036433 dated Aug. 29, 2019.

USPTO/ISA, International Search Report and Written Opinion for PCT Application No. PCT/US2019/058632 dated Jan. 17, 2020.

USPTO/ISA, International Search Report and Written Opinion for PCT Application No. PCT/US2020/45654 dated Oct. 29, 2020.

USPTO/ISA, International Search Report and Written Opinion for PCT Application No. PCT/US2021/024824 dated Jul. 27, 2021, 9 total pages.

USPTO/ISA, International Search Report and Written Opinion for PCT Application No. PCT/US2021/048505 dated Dec. 1, 2021, 11 total pages.

USPTO/ISA, International Search Report and Written Opinion for PCT Application No. PCT/US2022/022908, mail date Jul. 19, 2022.

USPTO/ISA, International Search Report and Written Opinion for PCT Application No. PCT/US2022/028378, mail date Aug. 19, 2022.

USPTO/ISA, International Search Report and Written Opinion for PCT Application No. PCT/US22/21206, mail date Jul. 7, 2022.

USPTO/ISA, International Search Report and Written Opinion for PCT Application No. PCT/US22/22632, mail date Jul. 19, 2022.

World Intellectual Property Organization, International Search Report and Written Opinion for International Application No. PCT/US2022/027796, mail date Aug. 17, 2022, 12 total p. Aug. 17, 2022.

World Intellectual Property Organization, International Search Report and Written Opinion for International Application No. PCT/US2022/027798, mail date Sep. 6, 2022, 8 total p. Sep. 6, 2022.

Wu et al., "Frequency band-gap measurement of two-dimensional air/silicon phononic crystals using layered slanted inger interdigital transducers", J. Appl. Phys. 97, 094916, 2005 (Year: 2005).

Y. Yang, A. Gao et al. "5 GHZ Lithium Niobate MEMS Resonators With High FOM of 153", 2017 IEEE 30th International Conference in Micro Electro Mechanical Systems (MEMS). Jan. 22-26, 2017. pp. 942-945.

Y. Yang, R. Lu et al. "Towards Ka Band Acoustics: Lithium Niobat Asymmetrical Mode Piezoelectric MEMS Resonators", Department of Electrical and Computer Engineering University of Illinois at Urbana-Champaign, May 2018. pp. 1-2.

Yanson Yang, Ruochen Lu, Songbin Gong, High Q Antisymmetric Mode Lithium Niobate MEMS Resonators With Spurious Mitigation, Journal of Microelectromechanical Systems, vol. 29, No. 2, Apr. 2020. Apr. 2, 2020.

Yu-Po Wong, Luyan Qiu, Naoto Matsuoka, Ken-ya Hashimoto, Broadband Piston Mode Operation for First-order Antisymmetric Mode Resonators, 2020 IEEE International Ultrasonics Symposium, Sep. 2020. Sep. 2020.

Zou, Jie "High-Performance Aluminum Nitride Lamb Wave Resonators for RF Front-End Technology" University of California, Berkeley, Summer 2015, pp. 63 (Year 2015) Jan. 2015.

* cited by examiner

TRANSVERSELY-EXCITED FILM BULK ACOUSTIC RESONATORS WITH CURVED SHAPED ENDS OF FINGERS OR OPPOSING BUSBARS

RELATED APPLICATION INFORMATION

This patent claims priority to U.S. provisional patent application No. 63/249,575, filed Sep. 29, 2021, entitled CURVED AND PARABOLIC BUSBAR-ELECTRODE GAPS.

A portion of the disclosure of this patent document contains material which is subject to copyright protection. This patent document may show and/or describe matter which is or may become trade dress of the owner. The copyright and trade dress owner has no objection to the facsimile reproduction by anyone of the patent disclosure as it appears in the Patent and Trademark Office patent files or records, but otherwise reserves all copyright and trade dress rights whatsoever.

BACKGROUND

Field

This disclosure relates to radio frequency filters using acoustic wave resonators, and specifically to filters for use in communications equipment.

Description of the Related Art

A radio frequency (RF) filter is a two-port device configured to pass some frequencies and to stop other frequencies, where "pass" means transmit with relatively low signal loss and "stop" means block or substantially attenuate. The range of frequencies passed by a filter is referred to as the "pass-band" of the filter. The range of frequencies stopped by such a filter is referred to as the "stop-band" of the filter. A typical RF filter has at least one pass-band and at least one stop-band. Specific requirements on a passband or stop-band depend on the specific application. For example, a "pass-band" may be defined as a frequency range where the insertion loss of a filter is better than a defined value such as 1 dB, 2 dB, or 3 dB. A "stop-band" may be defined as a frequency range where the rejection of a filter is greater than a defined value such as 20 dB, 30 dB, 40 dB, or greater depending on application.

RF filters are used in communications systems where information is transmitted over wireless links. For example, RF filters may be found in the RF front-ends of cellular base stations, mobile telephone and computing devices, satellite transceivers and ground stations, IoT (Internet of Things) devices, laptop computers and tablets, fixed point radio links, and other communications systems. RF filters are also used in radar and electronic and information warfare systems.

RF filters typically require many design trade-offs to achieve, for each specific application, the best compromise between performance parameters such as insertion loss, rejection, isolation, power handling, linearity, size and cost. Specific design and manufacturing methods and enhancements can benefit simultaneously one or several of these requirements.

Performance enhancements to the RF filters in a wireless system can have broad impact to system performance. Improvements in RF filters can be leveraged to provide system performance improvements such as larger cell size, longer battery life, higher data rates, greater network capacity, lower cost, enhanced security, higher reliability, etc. These improvements can be realized at many levels of the wireless system both separately and in combination, for example at the RF module, RF transceiver, mobile or fixed sub-system, or network levels.

High performance RF filters for present communication systems commonly incorporate acoustic wave resonators including surface acoustic wave (SAW) resonators, bulk acoustic wave (BAW) resonators, film bulk acoustic wave resonators (FBAR), and other types of acoustic resonators. However, these existing technologies are not well-suited for use at the higher frequencies and bandwidths proposed for future communications networks.

The desire for wider communication channel bandwidths will inevitably lead to the use of higher frequency communications bands. Radio access technology for mobile telephone networks has been standardized by the 3GPP ($3^{rd}$ Generation Partnership Project). Radio access technology for $5^{th}$ generation mobile networks is defined in the 5G NR (new radio) standard. The 5G NR standard defines several new communications bands. Two of these new communications bands are n77, which uses the frequency range from 3300 MHz to 4200 MHz, and n79, which uses the frequency range from 4400 MHz to 5000 MHz. Both band n77 and band n79 use time-division duplexing (TDD), such that a communications device operating in band n77 and/or band n79 use the same frequencies for both uplink and downlink transmissions. Bandpass filters for bands n77 and n79 must be capable of handling the transmit power of the communications device. WiFi bands at 5 GHz and 6 GHz also require high frequency and wide bandwidth. The 5G NR standard also defines millimeter wave communication bands with frequencies between 24.25 GHz and 40 GHz.

The Transversely-Excited Film Bulk Acoustic Resonator (XBAR) is an acoustic resonator structure for use in microwave filters. The XBAR is described in U.S. Pat. No. 10,491,291, titled TRANSVERSELY EXCITED FILM BULK ACOUSTIC RESONATOR. An XBAR resonator comprises an interdigital transducer (IDT) formed on a thin floating layer, or diaphragm, of or having a single-crystal piezoelectric material. The IDT includes a first set of parallel fingers, extending from a first busbar and a second set of parallel fingers extending from a second busbar. The first and second sets of parallel fingers are interleaved. A microwave signal applied to the IDT excites a shear primary acoustic wave in the piezoelectric diaphragm. XBAR resonators provide very high electromechanical coupling and high frequency capability. XBAR resonators may be used in a variety of RF filters including band-reject filters, band-pass filters, duplexers, and multiplexers. XBARs are well suited for use in filters for communications bands with frequencies above 3 GHz.

Throughout this description, elements appearing in figures are assigned three-digit or four-digit reference designators, where the two least significant digits are specific to the element and the one or two most significant digit is the figure number where the element is first introduced. An element that is not described in conjunction with a figure may be presumed to have the same characteristics and function as a previously-described element having the same reference designator.

DETAILED DESCRIPTION

Description of Apparatus

The Transversely-Excited Film Bulk Acoustic Resonator (XBAR) is a new resonator structure for use in microwave filters. The XBAR is described in U.S. Pat. No. 10,491,291, titled TRANSVERSELY EXCITED FILM BULK ACOUSTIC RESONATOR, which is incorporated herein by reference in its entirety. An XBAR resonator comprises a conductor pattern having an interdigital transducer (IDT) formed on a thin floating layer or diaphragm of a piezoelectric material. The IDT has two busbars which are each attached to a set of fingers and the two sets of fingers are interleaved on the diaphragm over a cavity formed in a substrate upon which the resonator is mounted. The diaphragm spans the cavity and may include front-side and/or back-side dielectric layers. A microwave signal applied to the IDT excites a shear primary acoustic wave in the piezoelectric diaphragm, such that the acoustic energy flows substantially normal to the surfaces of the layer, which is orthogonal or transverse to the direction of the electric field generated by the IDT. XBAR resonators provide very high electromechanical coupling and high frequency capability.

In this context, the coupling may be the frequency separation between resonance and anti-resonance for a resonator. This may be directly proportional to the "electromechanical coupling", which is the ratio of mechanical energy (e.g., energy put into the resonator A1 mode for an A1 mode resonator) versus electrical input energy. In this sense, it is how well the input electrical energy "couples" into the mechanical A1 XBAR mode trying to be excited.

A piezoelectric membrane may be a part of a plate of single-crystal piezoelectric material that spans a cavity in the substrate. A piezoelectric diaphragm may be the membrane and may include front-side and/or back-side dielectric layers. An XBAR resonator may be such a diaphragm or membrane with an interdigital transducer (IDT) formed on a diaphragm or membrane.

Figure 1:
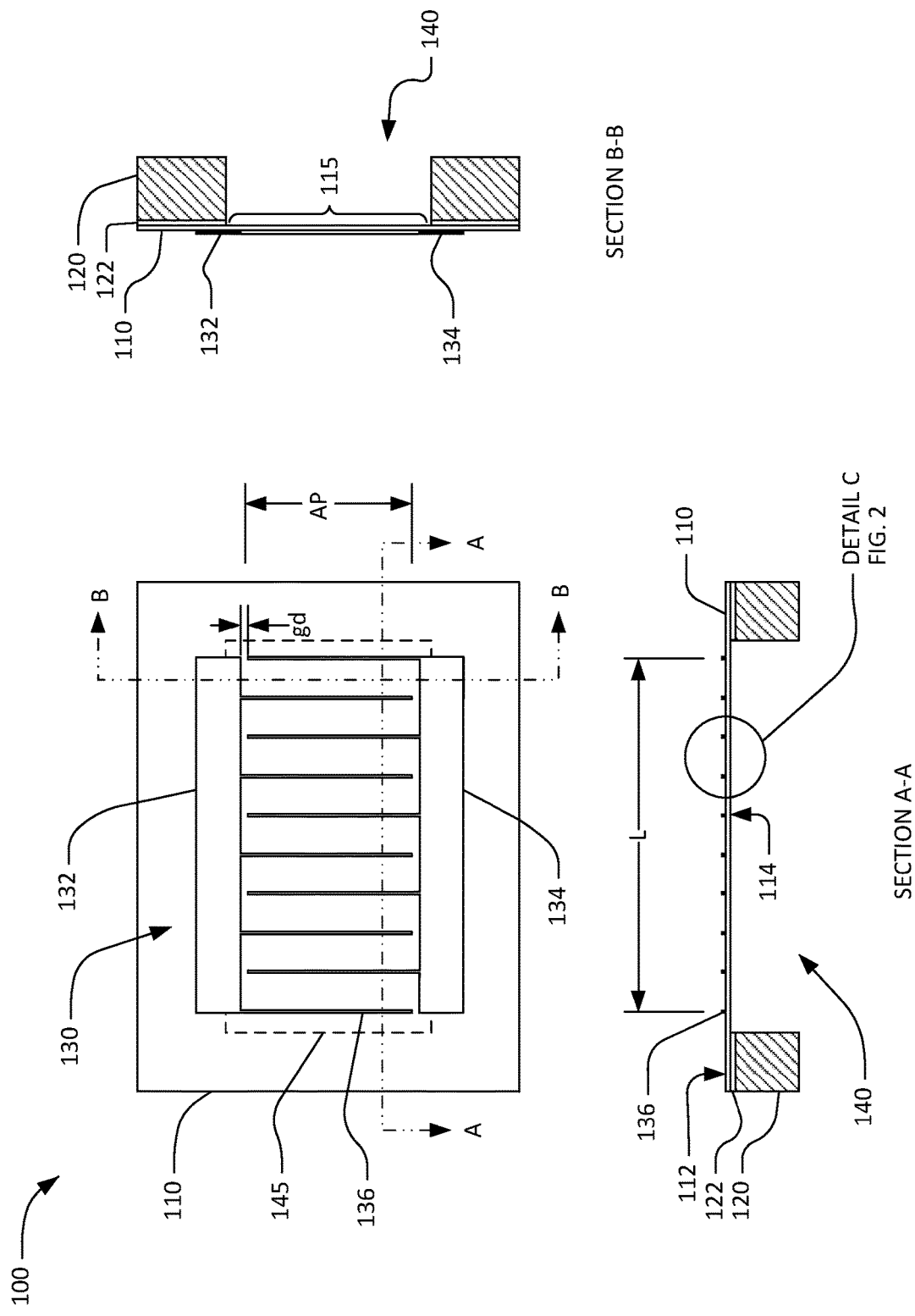
FIG. 1 includes a schematic plan view and two schematic cross-sectional views of a transversely-excited film bulk acoustic resonator (XBAR).

XBAR devices may exhibit undesired spurs and/or energy loss at the ends of the IDT fingers due to gap modes, such as transverse acoustic modes that propagate in the aperture direction parallel to the IDT fingers (e.g., modes in the plate along the direction of arrow AP of FIG. 1). These modes may be resonator A1 modes for an A1 mode resonator. The coupling of Z-cut lithium niobate plates of Z-cut XBARs is nearly isotropic, which is to say an electric field in any direction in the XY plane (e.g., along the planar shape of the plate) can excite a shear acoustic mode in the plate. In some cases, Z-cut XBARs suffer from parasitic oblique excitations due to transverse electric fields in the electrode to bus bar gap (e.g., BE gap). Over most of the area of the IDT of an XBAR, the direction of the electric field is perpendicular to the IDT fingers. However, in the regions between the ends of the IDT fingers and the opposing bus bars, the electric field may have transverse (i.e., parallel to the IDT fingers) or oblique (at some angle other than perpendicular or parallel to the IDT fingers) components. The transverse and/or oblique fields may excite parasitic acoustic waves at frequencies other than the intended frequency of the XBAR. These parasitic acoustic waves may increase the insertion loss and/or cause undesired spurs in the frequency response of a filter incorporating XBARs.

The following describes improved XBAR resonators, filters and fabrication techniques for XBAR resonators with electrode structures of the IDT fingers and busbars that tailor the electric field in the gaps between the IDT fingers and busbars to minimize undesired spurious effects. The ends of ID fingers or the inner surfaces of the opposing busbars may have a curved shape. In some cases, the electrode structures may form or include gaps (BE gaps) between ends of the interleaved fingers and opposing busbars that have one of circular gap shapes or parabolic gap shapes. The BE gaps may be tailored such that the oblique excitation either (a) has the same wavevector as the longitudinal XBAR mode or (b) results in reflection of the oblique excitation into a transverse standing wave. Each XBAR IDT pair is thus treated like a 2D cavity, with potential to better synergize with the 2D nature of Z-cut XBAR.

FIG. 1 shows a simplified schematic top view and orthogonal cross-sectional views of a transversely-excited film bulk acoustic resonator (XBAR) 100. XBAR resonators such as the resonator 100 may be used in a variety of RF filters including band-reject filters, band-pass filters, duplexers, and multiplexers. XBARs are particularly suited for use in filters for communications bands with frequencies above 3 GHz.

The XBAR 100 is made up of a thin film conductor pattern formed on a surface of a piezoelectric plate 110 having parallel front and back surfaces 112, 114, respectively. The piezoelectric plate is a thin single-crystal layer of a piezoelectric material such as lithium niobate, lithium tantalate, lanthanum gallium silicate, gallium nitride, or aluminum nitride. The piezoelectric plate is cut such that the orientation of the X, Y, and Z crystalline axes with respect to the front and back surfaces is known and consistent. The piezoelectric plate may be Z-cut (which is to say the Z axis is normal to the front and back surfaces 112, 114), rotated Z-cut, or rotated YX cut. XBARs may be fabricated on piezoelectric plates with other crystallographic orientations.

The back surface 114 of the piezoelectric plate 110 is attached to a substrate 120 that provides mechanical support to the piezoelectric plate 110. The substrate 120 may be, for example, silicon, sapphire, quartz, or some other material. The substrate may have layers of silicon thermal oxide (TOX) and crystalline silicon. The back surface 114 of the piezoelectric plate 110 may be bonded to the substrate 120 using a wafer bonding process, or grown on the substrate 120, or attached to the substrate in some other manner. The piezoelectric plate is attached directly to the substrate or may be attached to the substrate via a bonding oxide (BOX) layer or an intermediate layer 122, such as a layer of SiO2, or another oxide such as Al2O3.

As shown in FIG. 1, the diaphragm 115 is contiguous with the rest of the piezoelectric plate 110 around all of a perimeter 145 of the cavity 1. In this context, "contiguous"

means "continuously connected without any intervening item". However, it is possible for a bonding oxide layer (BOX) to bond the plate 110 to the substrate 120. The BOX layer may exist between the plate and substrate around perimeter 145 and may extend further away from the cavity than just within the perimeter itself. In the absence of a process to remove it (i.e., this invention) the BOX is everywhere between the piezoelectric plate and the substrate. The BOX is typically removed from the back of the diaphragm 115 as part of forming the cavity.

The conductor pattern of the XBAR 100 includes an interdigital transducer (IDT) 130. The IDT 130 includes a first plurality of parallel fingers, such as finger 136, extending from a first busbar 132 and a second plurality of fingers extending from a second busbar 134. The first and second pluralities of parallel fingers are interleaved. The interleaved fingers 136 overlap for a distance AP, commonly referred to as the "aperture" of the IDT. The center-to-center distance L between the outermost fingers of the IDT 130 is the "length" of the IDT.

There are gap distances gd from the tip of the IDT finger ends to the nearest surface of the opposing busbar. Distances gd can be in a range of between 1 and 10 um. The gap distances gd may be in a direction tangential to the tip of the finger end. The gap distances gd may be between 1 and 5 um. It may be between 2 and 4 um. It may be 3 um. The gap distance gd may be the pitch p minus the mark m or width of the fingers.

A 2-dimensional (2D) electrostatic simulation shows that there is electric potential and electric field decay gap distance that is independent of the BE gap previously termed gd, if the BE gap is sufficiently large such as for gap distance at or greater than 3 um. The simulation may be performed for an XBAR with pitch p=4 um; mark or width w=1 um; and an IDT-IDT adjacent finger lateral gap=3 um (e.g., p-w).

The simulation may be an electro-magnetic (EM) field solver for electric machines, transformers, wireless charging, permanent magnet latches, actuators and other electromechanical devices. It solves static, frequency-domain and time-varying magnetic and electric fields. It may be an ANSYS Maxwell simulation.

The simulation shows that electric field Ey decay length in a BE gap is likely correlated to pitch length, such as to IDT finger pair lateral gap distance between lengths of adjacent fingers. Electric field Ey may approach or be 0 in BE gaps with gap distance at or greater than 3 um (e.g., from the end of the fingers to the opposing busbar).

Thus, the simulation show that electric field profile is not matched to rectangular finger ends or bus bar edges, and that other shaped edges may be used. It also shows that for certain gap distance, electrostatic voltage and electric field Ey are independent of the BE gap distance.

The first and second busbars 132, 134 serve as the terminals or electrodes of the XBAR 100. A radio frequency or microwave signal applied between the two busbars 132, 134 of the IDT 130 excites a primary acoustic mode within the piezoelectric plate 110. As will be discussed in further detail, the excited primary acoustic mode is a bulk shear mode where acoustic energy propagates along a direction substantially orthogonal to the surface of the piezoelectric plate 110, which is also normal, or transverse, to the direction of the electric field created by the IDT fingers. Thus, the XBAR is considered a transversely-excited film bulk wave resonator.

A cavity 140 is formed in the substrate 120 such that a portion 115 of the piezoelectric plate 110 containing the IDT 130 is suspended over the cavity 140 without contacting the substrate 120 or the bottom of the cavity. "Cavity" has its conventional meaning of "an empty space within a solid body." The cavity may contain a gas, air, or a vacuum. In some case, there is also a second substrate, package or other material having a cavity (not shown) above the plate 110, which may be a mirror image of substrate 120 and cavity 140. The cavity above plate 110 may have an empty space depth greater than that of cavity 140. The fingers extend over (and part of the busbars may optionally extend over) the cavity (or between the cavities). The cavity 140 may be a hole completely through the substrate 120 (as shown in Section A-A and Section B-B of FIG. 1) or a recess in the substrate 120 (as shown subsequently in FIG. 3A). The cavity 140 may be formed, for example, by selective etching of the substrate 120 before or after the piezoelectric plate 110 and the substrate 120 are attached. As shown in FIG. 1, the cavity 140 has a rectangular shape with an extent greater than the aperture AP and length L of the IDT 130. A cavity of an XBAR may have a different shape, such as a regular or irregular polygon. The cavity of an XBAR may more or fewer than four sides, which may be straight or curved.

The portion 115 of the piezoelectric plate suspended over the cavity 140 will be referred to herein as the "diaphragm" (for lack of a better term) due to its physical resemblance to the diaphragm of a microphone. The diaphragm may be continuously and seamlessly connected to the rest of the piezoelectric plate 110 around all, or nearly all, of perimeter of the cavity 140. In this context, "contiguous" means "continuously connected without any intervening item". In some cases, a BOX layer may bond the plate 110 to the substrate 120 around the perimeter.

For ease of presentation in FIG. 1, the geometric pitch and width of the IDT fingers is greatly exaggerated with respect to the length (dimension L) and aperture (dimension AP) of the XBAR. A typical XBAR has more than ten parallel fingers in the IDT 110. An XBAR may have hundreds, possibly thousands, of parallel fingers in the IDT 110. Similarly, the thickness of the fingers in the cross-sectional views is greatly exaggerated.

Figure 2:
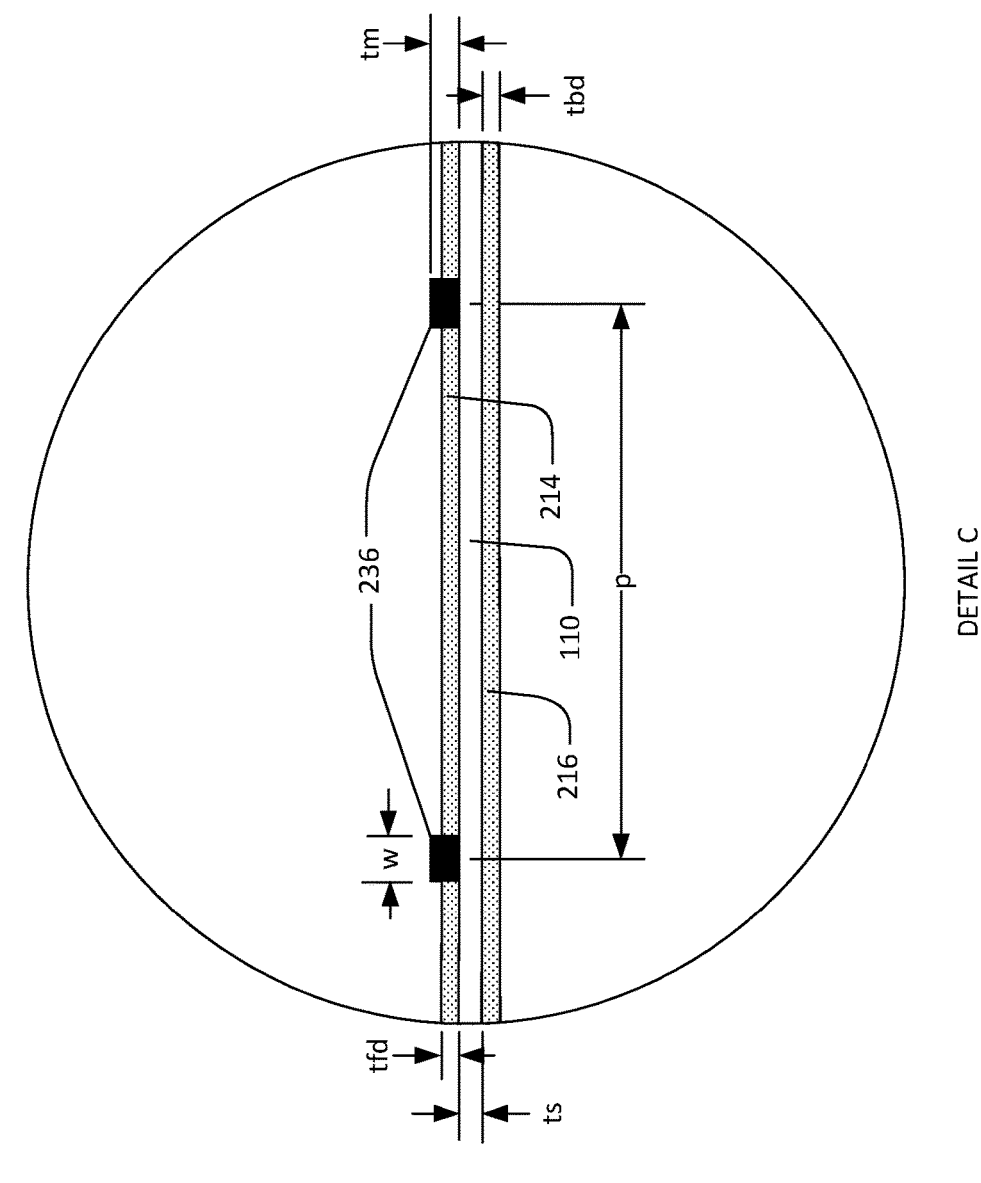
FIG. 2 is an expanded schematic cross-sectional view of a portion of the XBAR of FIG. 1.

FIG. 2 shows a detailed schematic cross-sectional view of the XBAR 100 of FIG. 1. The cross-sectional view may be a portion of the XBAR 100 that includes fingers of the IDT. The piezoelectric plate 110 is a single-crystal layer of piezoelectrical material having a thickness ts. The ts may be, for example, 100 nm to 1500 nm. When used in filters for LTE™ bands from 3.4 GHZ to 6 GHz (e.g. bands 42, 43, 46), the thickness ts may be, for example, 200 nm to 1000 nm.

The plate 110 may be Z-cut LN, 82-Y cut LN, 120-Y cut LN or 128-Y cut LN. In some cases, the plate 110 may be cut in a range between 82-Y cut to Z-cut; or between 110-Y and 157-Y cut. It may have a thickness ts of between 70 nm and 500 nm. It may have a thickness ts of between 350 nm and 450 nm. The thickness ts may be 400 nm.

A front-side dielectric layer 214 may optionally be formed on the front side of the piezoelectric plate 110. The "front side" of the XBAR is, by definition, the surface facing away from the substrate. The front-side dielectric layer 214 has a thickness tfd. The front-side dielectric layer 214 is formed between the IDT fingers 238. Although not shown in FIG. 2, the front side dielectric layer 214 may also be deposited over the IDT fingers 238. A back-side dielectric layer 216 may optionally be formed on the back side of the piezoelectric plate 110. The back-side dielectric layer 216 has a thickness tbd. The front-side and back-side dielectric layers 214, 216 may be a non-piezoelectric dielectric material, such as silicon dioxide or silicon nitride. The tfd and tbd may be, for example, 0 to 500 nm. tfd and tbd are typically less than the thickness ts of the piezoelectric plate. The tfd and tbd are not necessarily equal, and the front-side and back-side dielectric layers 214, 216 are not necessarily the same material. Either or both of the front-side and back-side dielectric layers 214, 216 may be formed of multiple layers of two or more materials.

The front side dielectric layer 214 may be formed over the IDTs of some (e.g., selected ones) of the XBAR devices in a filter. The front side dielectric 214 may be formed between and cover the IDT finger of some XBAR devices but not be formed on other XBAR devices. For example, a front side frequency-setting dielectric layer may be formed over the IDTs of shunt resonators to lower the resonance frequencies of the shunt resonators with respect to the resonance frequencies of series resonators, which have thinner or no front side dielectric. Some filters may include two or more different thicknesses of front side dielectric over various resonators. The resonance frequency of the resonators can be set thus "tuning" the resonator, at least in part, by selecting a thicknesses of the front side dielectric.

Further, a passivation layer may be formed over the entire surface of the XBAR device 100 except for contact pads where electric connections are made to circuitry external to the XBAR device. The passivation layer is a thin dielectric layer intended to seal and protect the surfaces of the XBAR device while the XBAR device is incorporated into a package. The front side dielectric layer and/or the passivation layer may be, $SiO_2$, $Si_3N_4$, $Al_2O_3$, some other dielectric material, or a combination of these materials.

The thickness of the passivation layer may be selected to protect the piezoelectric plate and the metal electrodes from water and chemical corrosion, particularly for power durability purposes. It may range from 10 to 100 nm. The passivation material may consist of multiple oxide and/or nitride coatings such as SiO2 and Si3N4 material.

The IDT fingers 238 may be one or more layers of aluminum or a substantially aluminum alloy, copper or a substantially copper alloy, beryllium, tungsten, molybdenum, gold, or some other conductive material. Thin (relative to the total thickness of the conductors) layers of other metals, such as chromium or titanium, may be formed under and/or over the fingers to improve adhesion between the fingers and the piezoelectric plate 110 and/or to passivate or encapsulate the fingers. The busbars (132, 134 in FIG. 1) of the IDT may be made of the same or different materials as the fingers.

Dimension p is the center-to-center spacing or "pitch" of the IDT fingers, which may be referred to as the pitch of the IDT and/or the pitch of the XBAR. When the center-to-center spacing of the IDT fingers varies along the length of the IDT, the "pitch" is the average of the center-to-center spacings of all pairs of adjacent fingers. Dimension w is the width or "mark" of the IDT fingers. The IDT of an XBAR differs substantially from the IDTs used in surface acoustic wave (SAW) resonators. In a SAW resonator, the pitch of the IDT is one-half of the acoustic wavelength at the resonance frequency. Additionally, the mark-to-pitch ratio of a SAW resonator IDT is typically close to 0.5 (i.e. the mark or finger width is about one-fourth of the acoustic wavelength at resonance). In an XBAR, the pitch p of the IDT is typically 2 to 20 times the width w of the fingers. In addition, the pitch p of the IDT is typically 2 to 20 times the thickness ts of the piezoelectric slab 212. The pitch p may be between 3 um and 8 um. The pitch p may be between 4 um and 5 um. The plate thickness ts may be between 300 nm and 500 nm. The plate thickness ts may be 400 nm. The finger width w may be between 0.5 um and 7.5 um. The finger width w may be 1 um. The width of the IDT fingers in an XBAR is not constrained to one-fourth of the acoustic wavelength at resonance. For example, the width of XBAR IDT fingers may be 500 nm or greater, such that the IDT can be fabricated using optical lithography. The thickness tm of the IDT fingers may be from 100 nm to about equal to the width w. The thickness of the busbars (132, 134 in FIG. 1) of the IDT may be the same as, or greater than, the thickness tm of the IDT fingers.

Figure 3A:
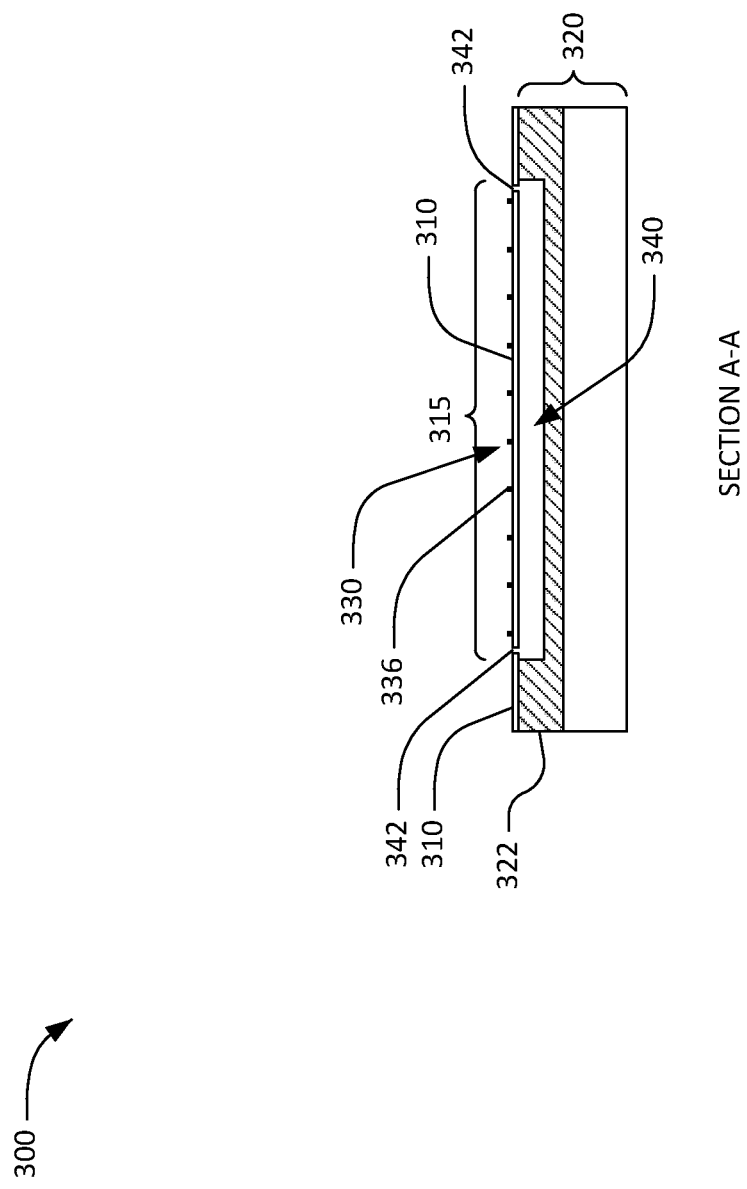
FIG. 3A is an alternative schematic cross-sectional view of an XBAR.

FIG. 3A is an alternative cross-sectional view of XBAR device 300 along the section plane A-A defined in FIG. 1. In FIG. 3A, a piezoelectric plate 310 is attached to an intermediate layer 322 of a substrate 320. A portion of the piezoelectric plate 310 forms a diaphragm 315 spanning a cavity 340 in the substrate. The cavity 340, does not fully penetrate the intermediate layer 322, and is formed in the layer 322 under the portion of the piezoelectric plate 310 containing the IDT 330 of a conductor pattern (e.g., first metal or M1 layer) of an XBAR. Fingers, such as finger 336, of an IDT are disposed on the diaphragm 315. Interconnection of the IDT (e.g., busbars) 330 to signal and ground paths may be through a second conductor pattern (e.g., M2 metal layer, not shown in FIGS. 1-3A) to electrical contacts on a package.

Plate 310, diaphragm 315 and fingers 336 may be plate 110, diaphragm 115 and fingers 136 (or 236). The cavity 340 may be formed, for example, by etching the substrate 320 before attaching the piezoelectric plate 310. Alternatively, the cavity 340 may be formed by etching the substrate 320 with a selective etchant that reaches the substrate through one or more openings 342 provided in the piezoelectric plate 310. The diaphragm 315 may be contiguous with the rest of the piezoelectric plate 310 around a large portion of a perimeter 345 of the cavity 340. For example, the diaphragm 315 may be contiguous with the rest of the piezoelectric plate 310 around at least 50% of the perimeter of the cavity 340.

Intermediate layer 322 may be one or more intermediate material layers attached between plate 310 and substrate 320. An intermediary layer may be or include a bonding layer, a BOX layer, an etch stop layer, a sealing layer, an adhesive layer or layer of other material that is attached or bonded to plate 310 and substrate 320. A layer of layers 322 may be a dielectric, an oxide, a silicon oxide, silicon nitride, an aluminum oxide, silicon dioxide or silicon nitride. Layers 322 may be one or more of any of these layers or a combination of these layers.

While the cavity 340 is shown in cross-section, it should be understood that the lateral extent of the cavity is a continuous closed band area of layer 322 that surrounds and defines the size of the cavity 340 in the direction normal to the plane of the drawing. The lateral (i.e. left-right as shown in the figure) extent of the cavity 340 is defined by the lateral edges layer 322. The vertical (i.e. down from plate 310 as shown in the figure) extent or depth of the cavity 340 into layer 322. In this case, the cavity 340 has a side cross-section rectangular, or nearly rectangular, cross section.

The XBAR 300 shown in FIG. 3A will be referred to herein as a "front-side etch" configuration since the cavity 340 is etched from the front side of the layer 322 (before or after attaching the piezoelectric plate 310). The XBAR 100 of FIG. 1 will be referred to herein as a "back-side etch" configuration since the cavity 140 is etched from the back side of the substrate 120 after attaching the piezoelectric plate 110. The XBAR 300 shows one or more openings 342 in the piezoelectric plate 310 at the left and right sides of the cavity 340. However, in some cases openings 342 in the piezoelectric plate 310 are only at the left or right side of the cavity 340.

In some cases, although not shown in the figure, layer 322 is a thinner layer than the depth of the cavity such that the plate is bonded directly to layer 322; and the cavity is formed in and etched into the layer 322 and into the substrate 320. Here, the cavity extends completely through layer 322 and has a cavity bottom in the substrate 320.

Figure 3B:
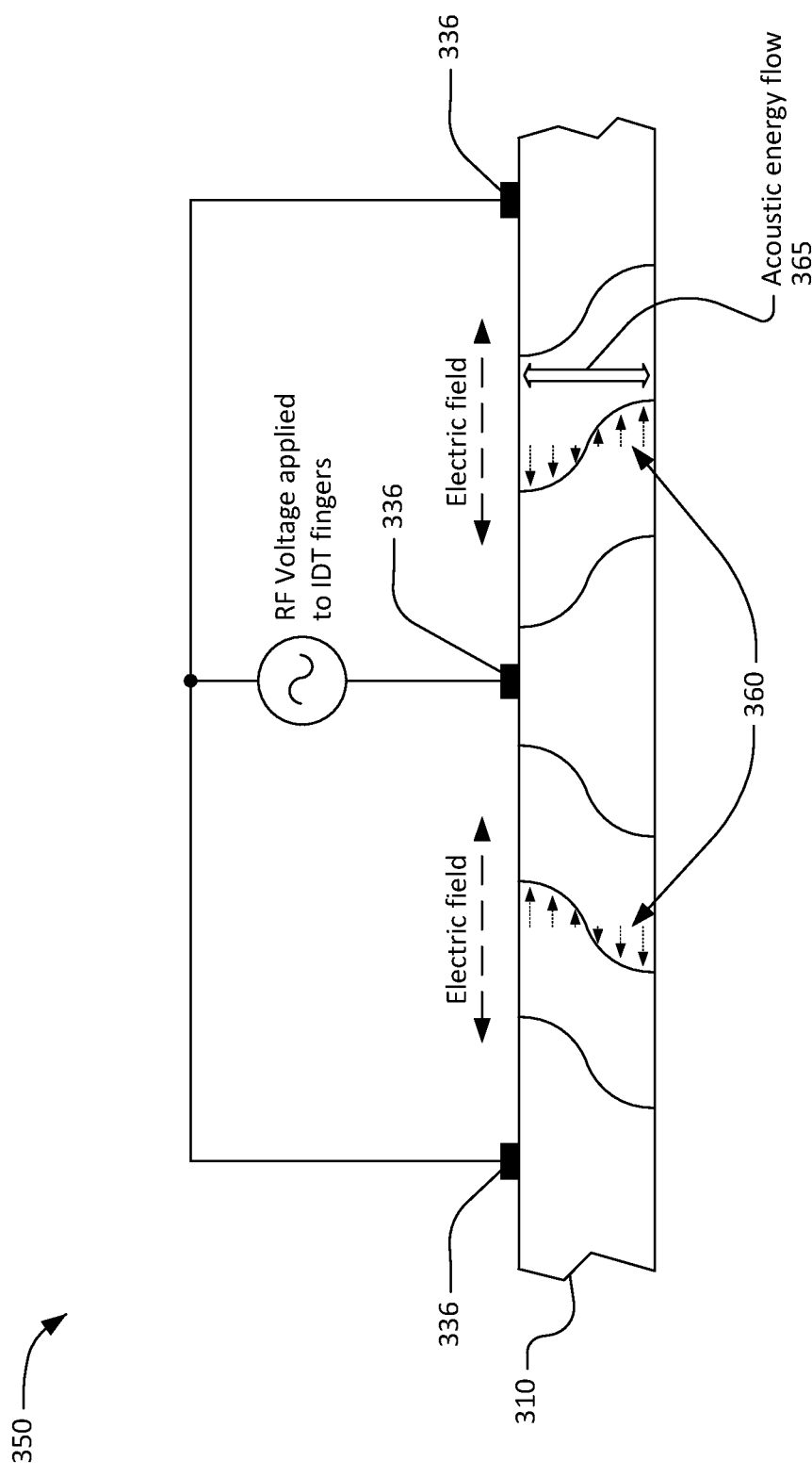
FIG. 3B is a graphical illustration of the primary acoustic mode of interest in an XBAR.

FIG. 3B is a graphical illustration of the primary acoustic mode of interest in an XBAR. FIG. 3B shows a small portion of an XBAR 350 including a piezoelectric plate 310 and three interleaved IDT fingers 336. XBAR 350 may be part of any XBAR herein. An RF voltage is applied to the interleaved fingers 336. This voltage creates a time-varying electric field between the fingers. The direction of the electric field is primarily lateral, or parallel to the surface of the piezoelectric plate 310, as indicated by the arrows labeled "electric field". Due to the high dielectric constant of the piezoelectric plate, the electric field is highly concentrated in the plate relative to the air. The lateral electric field introduces shear deformation, and thus strongly excites a primary shear-mode acoustic mode, in the piezoelectric plate 310. In this context, "shear deformation" is defined as deformation in which parallel planes in a material remain parallel and maintain a constant distance while translating relative to each other. A "shear acoustic mode" is defined as an acoustic vibration mode in a medium that results in shear deformation of the medium. The shear deformations in the XBAR 350 are represented by the curves 360, with the adjacent small arrows providing a schematic indication of the direction and magnitude of atomic motion. The degree of atomic motion, as well as the thickness of the piezoelectric plate 310, have been greatly exaggerated for ease of visualization. While the atomic motions are predominantly lateral (i.e. horizontal as shown in FIG. 3B), the direction of acoustic energy flow of the excited primary shear acoustic mode is substantially orthogonal to the front and back surface of the piezoelectric plate, as indicated by the arrow 365.

An acoustic resonator based on shear acoustic wave resonances can achieve better performance than current state-of-the art film-bulk-acoustic-resonators (FBAR) and solidly-mounted-resonator bulk-acoustic-wave (SMR BAW) devices where the electric field is applied in the thickness direction. The piezoelectric coupling for shear wave XBAR resonances can be high (>20%) compared to other acoustic resonators. High piezoelectric coupling enables the design and implementation of microwave and millimeter-wave filters with appreciable bandwidth.

Figure 4A:
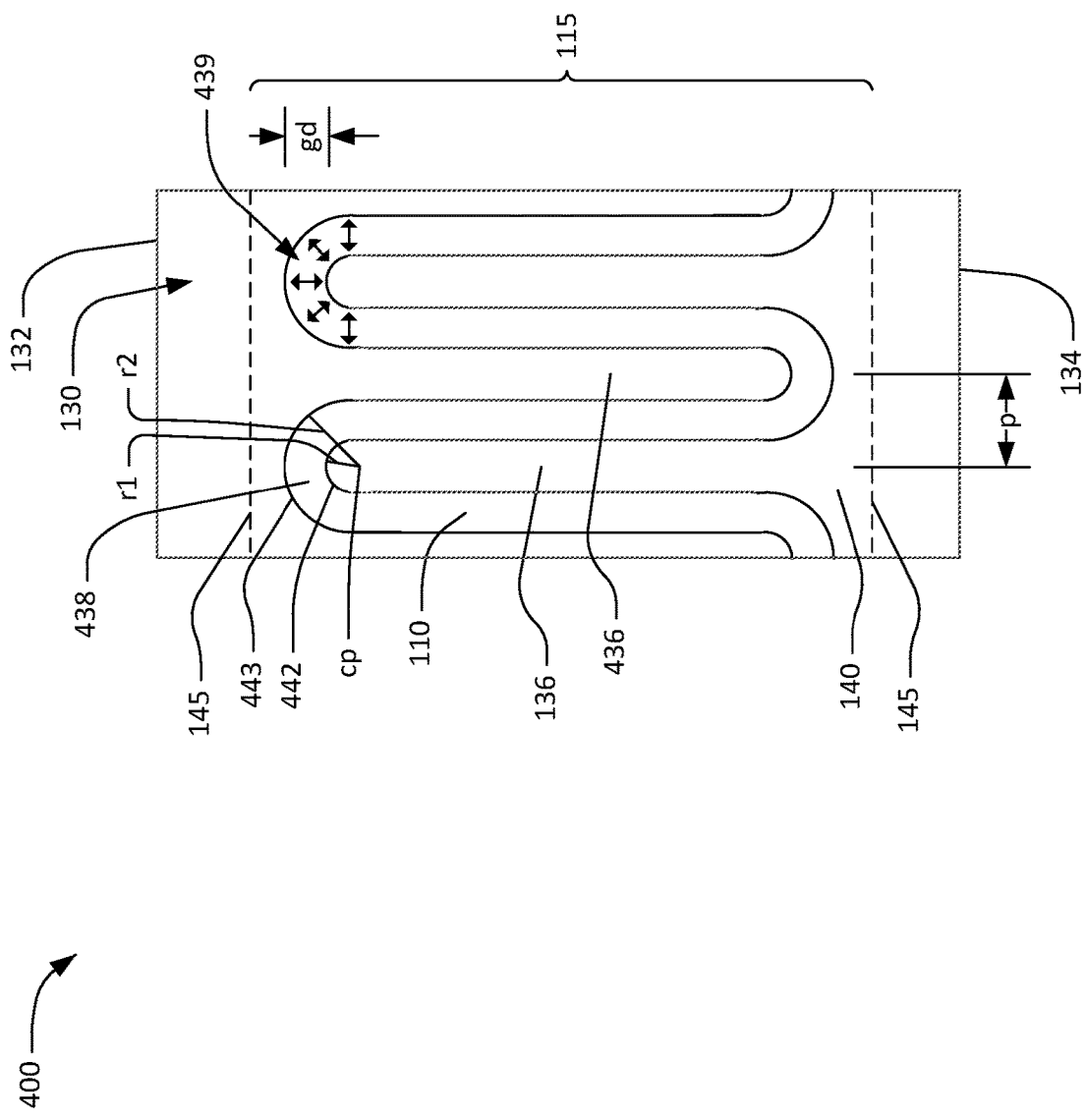
FIG. 4A shows a simplified schematic top view of an XBAR with circular shaped busbar-electrode gaps.

FIG. 4A shows a simplified schematic top view of an XBAR 400 with circular shaped busbar-electrode gaps. Device 400 may represent a version of device 100, 300 and/or 350 but with circular instead of square or rectangular bus bar—electrode (BE) gap shapes 438 between ends of the interleaved fingers 136 and opposing busbar 132 or 134. Device 400 is shown with semicircular ends 442 of the fingers 136 and semicircular inner surface 443 of the busbar 132, while devices 100, 300 and 350 have flat or square ends of the finger and inner surfaces of the bus bars, such as shown in FIG. 1A. These circular gap shapes 438 are formed by areas of the plate 110 between circular shaped ends 442 of the interleaved fingers and larger circular shaped inner surfaces 443 of the opposing busbars.

The circular shaped ends 443 of the interleaved fingers and the circular shaped inner surfaces 443 of the opposing busbars are circles or semicircles with different radii r1 and r2, respectively; but have a same center point cp. The gap distance may be equal to the r2 minus r1. The gap distance gd may be from the tip of the finger ends to the nearest surface of the opposing busbar. Gap distance gd may be as described for FIG. 1-2. In some cases, in this figure, r1=w/2 (half of the finger width) and r2=p−w/2. The gap distance is p−w.

For device 400 the gaps are circular gap shapes 438 that result in the oblique excitation having the same wavevector as the longitudinal XBAR mode on a Z-cut LiNbO3 membrane as shown by arrows 439. Device 400 XBAR IDT pairs of busbar/fingers 132/436 and 134/136 can be treated like a 2-dimensional (2D) cavity in the planar X-Y direction of plate 110, with potential to better control the acoustic dispersion of the Z-cut XBAR device 400. Although the XBAR mode is guided primarily parallel to the busbars, XBAR resonators on Z-cut are especially susceptible to transverse acoustic wave propagation.

Figure 4B:
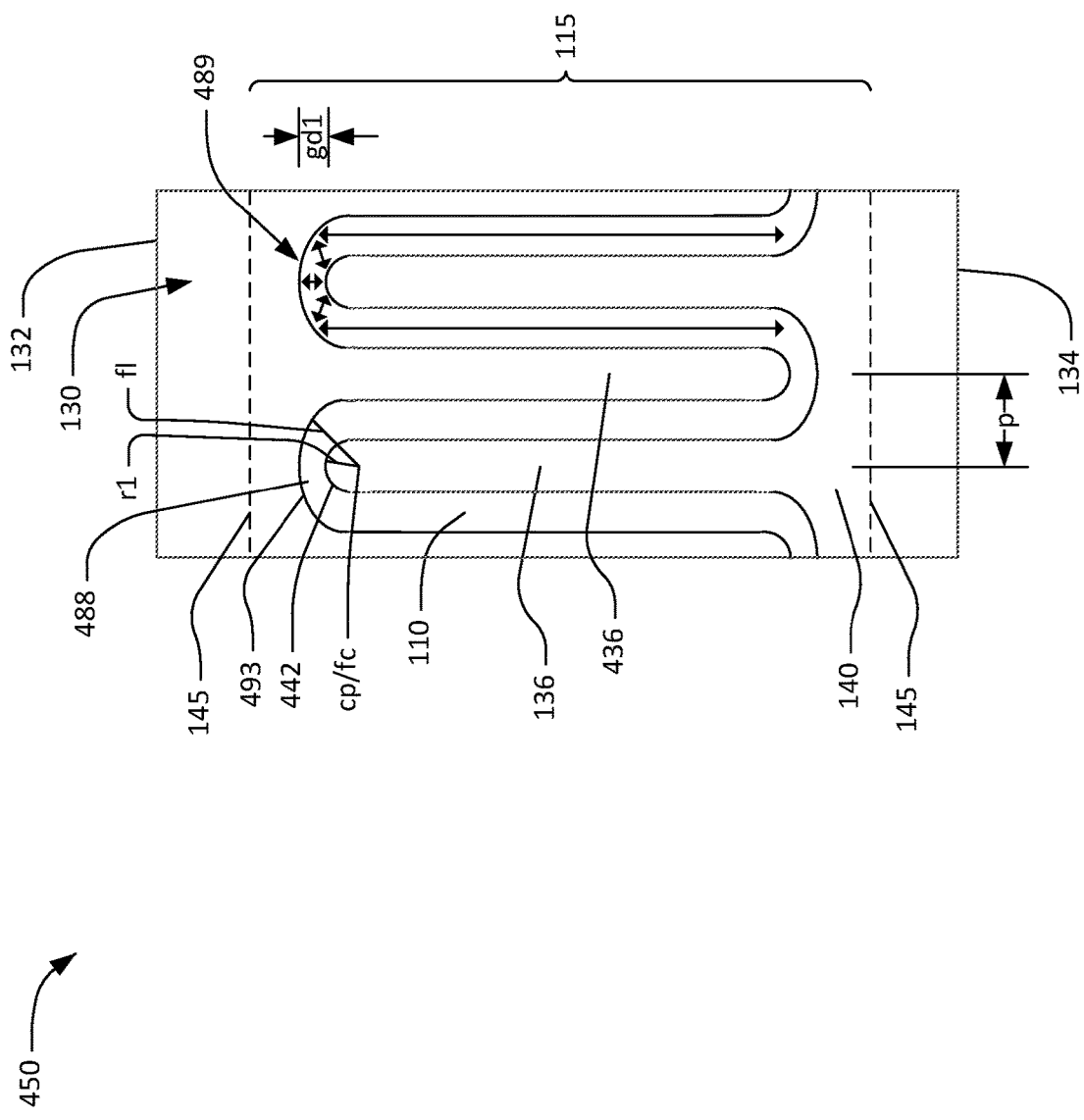
FIG. 4B shows a simplified schematic top view of an XBAR with parabolic shaped busbar-electrode gaps.

FIG. 4B shows a simplified schematic top view of an XBAR 450 with parabolic shaped busbar-electrode gaps. Device 450 may represent a version of device 100, 300 and/or 350 but with parabolic instead of square or rectangular bus bar—electrode (BE) gap shapes 488 between ends of the interleaved fingers 136 and opposing busbar 132 or 134. Device 450 is shown with semicircular ends 442 of the fingers 136 and parabolic inner surface 493 of the busbar 132, while devices 100, 300 and 350 have flat or square ends of the finger and inner surfaces of the bus bars, such as shown in FIG. 1A. These parabolic shapes 488 are formed by areas of the plate 110 between circular shaped ends 442 of the interleaved fingers and larger parabolic shaped inner surfaces 493 of the opposing busbars.

The circular shaped ends 443 of the interleaved fingers are circles or semicircles with radius r1 and center point cp, while the parabolic shaped inner surfaces 493 of the opposing busbars have a focus fc at the center cp, and a focal length f1 that is greater than the radius r1. The gap distance gd1 may be equal to the f1 minus r1 at the shortest distance between ends 443 and surfaces 493. The gap distance gd may be from the tip of the finger ends to the nearest surface of the opposing busbar. Gap distance gd1 may be a distance as described for distance gd of FIG. 1-2.

For device 450 the gaps are parabolic gap shapes 488 that result in reflection of the oblique excitation into a transverse standing wave as shown by arrows 489. The parabolic gap can also change the coupling to non-XBAR acoustic modes by modifying the electric field profile in the BE gap region. Device 450 XBAR IDT pairs of busbars/fingers 132/436 and 134/136 can be treated like a 2-dimensional (2D) cavity in the planar X-Y direction of plate 110, with potential to better control the acoustic dispersion of the Z-cut XBAR device 400.

FIGS. 4A and 4B also show resonators 400 and 450 comprising piezoelectric plate 110 having a parallel front and back surface. The back surface of the plate is attached to a top surface of an intermediary layer of a substrate (not visible but behind the piezoelectric plate 110) except for a portion of the piezoelectric plate 110 forming a diaphragm 115 spanning a cavity 140 in the intermediary layer. The dashed line is the perimeter 145 of the cavity 140 and of diaphragm 115 which are defined by the intersection of the cavity and the surface of the intermediary layer. The portion of the piezoelectric plate 110 within the dashed line is the diaphragm 115 and diaphragm 115 has an edge at perimeter 145.

The piezoelectric plate has a plate thickness ts (not shown but extending into the page, also see FIG. 2) between the piezoelectric plate front and back surfaces. Thickness ts may be a constant thickness. Thickness ts may be a constant thickness where the plate spans the cavity.

An IDT 130 is formed on the front surface of the piezoelectric plate facing away from the cavity 140. The IDT 130 includes a first busbar 432, a second busbar 434, and a plurality of interleaved fingers 136 and 436, disposed on the diaphragm 115. During use, the busbars 132 and 134 may be connected to opposing signal connections, or input and output filter connections.

Devices 400 and 450 have an IDT pitch p similar to devices 100, 300 and 350 that is a center-to-center spacing between adjacent ones of the interleaved fingers 136 and 436. Devices 400 and 450 have first set of the interleaved fingers 436 attached to busbar 142 that opposes second set of the interleaved fingers 136. The second set of the interleaved fingers 136 is attached to a second busbar 134 that opposes the first set of the interleaved fingers 436. A radio frequency signal applied to the IDT 130 of device 400 or device 450 excites a primary shear acoustic mode in the piezoelectric plate 400 over the cavity 140. The plate 110 is a Z-cut lithium niobate or lithium tantalate piezoelectric material. Gap distance gd may be the pitch p minus a width w of the fingers.

For some embodiments, a circle or semicircle is a shape with a curved part having a constant radius r from a center point. For some embodiments, a parabola is a shape involving a point (the focus) and a line (the directrix); the focus does not lie on the directrix; and the parabola is the locus of points in that plane that are equidistant from both the directrix and the focus. The point where the parabola intersects its axis of symmetry is called the "vertex". The distance between the vertex and the focus, measured along the axis of symmetry, is the "focal length".

During use of XBARs 400 and 450, a radio frequency signal applied to the IDT 130 (e.g., to busbar 132 and/or 134) excites a primary shear acoustic mode in the piezoelectric plate over the cavity; and wherein a thickness of the piezoelectric plate or diaphragm is selected to tune the primary shear acoustic mode in the piezoelectric plate. The radio frequency signal may be applied to or across the busbars 132 and 134 in series or in parallel. The radio frequency signal may be applied to the busbars 132 and 134 to use the XBAR 400 or 450 as a shunt or as a series resonator as noted in FIG. 5.

Figure 5:
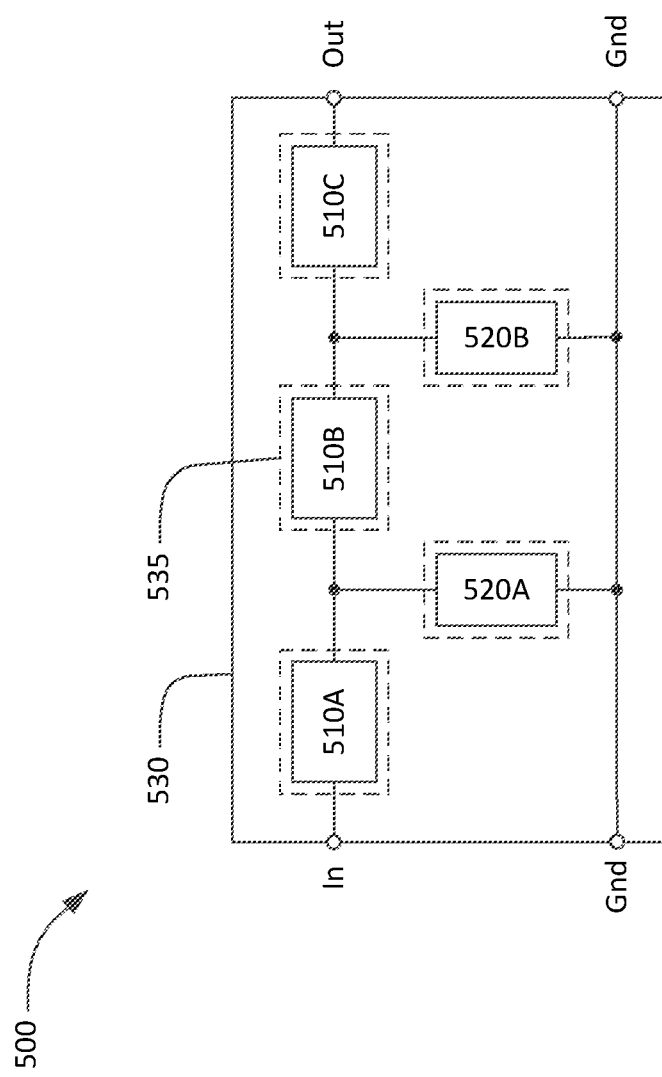
FIG. 5 is a schematic block diagram of a filter using XBARs.

FIG. 5 is a schematic circuit diagram and layout for a high frequency band-pass filter 500 using XBARs where the two connections to an XBAR that are shown are connections to the two busbars of the XBAR. The filter 500 has a conventional ladder filter architecture including three series resonators 510A, 510B, 510C and two shunt resonators 520A, 520B. The three series resonators 510A, 510B, and 510C are connected in series between a first port and a second port (hence the term "series resonator"). Any number of the resonators of filter 500 may be XBAR 400, XBAR 450 or an example of that XBAR. In FIG. 5, the first and second ports are labeled "In" and "Out", respectively. However, the filter 500 is bidirectional and either port may serve as the input or output of the filter. The two shunt resonators 520A, 520B are connected from nodes between the series resonators to ground. A filter may contain additional reactive components, such as inductors, not shown in FIG. 5. All the shunt resonators and series resonators are XBARs. The inclusion of three series and two shunt resonators is exemplary. A filter may have more or fewer than five total resonators, more or fewer than three series resonators, and more or fewer than two shunt resonators. Typically, all of the series resonators are connected in series between an input and an output of the filter. All of the shunt resonators are typically connected between ground and the input, the output, or a node between two series resonators.

In the exemplary filter 500, the three series resonators 510A, B, C and the two shunt resonators 520A, B of the filter 500 are formed on a single plate 530 of piezoelectric material bonded to a silicon substrate (not visible). Each resonator includes a respective IDT (not shown), with at least the fingers of the IDT disposed over a cavity in the substrate. In this and similar contexts, the term "respective" means "relating things each to each", which is to say with a one-to-one correspondence. In FIG. 5, the cavities are illustrated schematically as the dashed rectangles (such as the rectangle 535). In this example, each IDT is disposed over a respective cavity. In other filters, the IDTs of two or more resonators may be disposed over a single cavity.

Each of the resonators 510A, 510B, 510C, 520A, 520B in the filter 500 has resonance where the admittance of the resonator is very high and an anti-resonance where the admittance of the resonator is very low. The resonance and anti-resonance occur at a resonance frequency and an anti-resonance frequency, respectively, which may be the same or different for the various resonators in the filter 500. In over-simplified terms, each resonator can be considered a short-circuit at its resonance frequency and an open circuit at its anti-resonance frequency. The input-output transfer function will be near zero at the resonance frequencies of the shunt resonators and at the anti-resonance frequencies of the series resonators. In a typical filter, the resonance frequencies of the shunt resonators are positioned below the lower edge of the filter's passband and the anti-resonance frequencies of the series resonators are position above the upper edge of the passband.

DESCRIPTION OF METHODS

Figure 6:
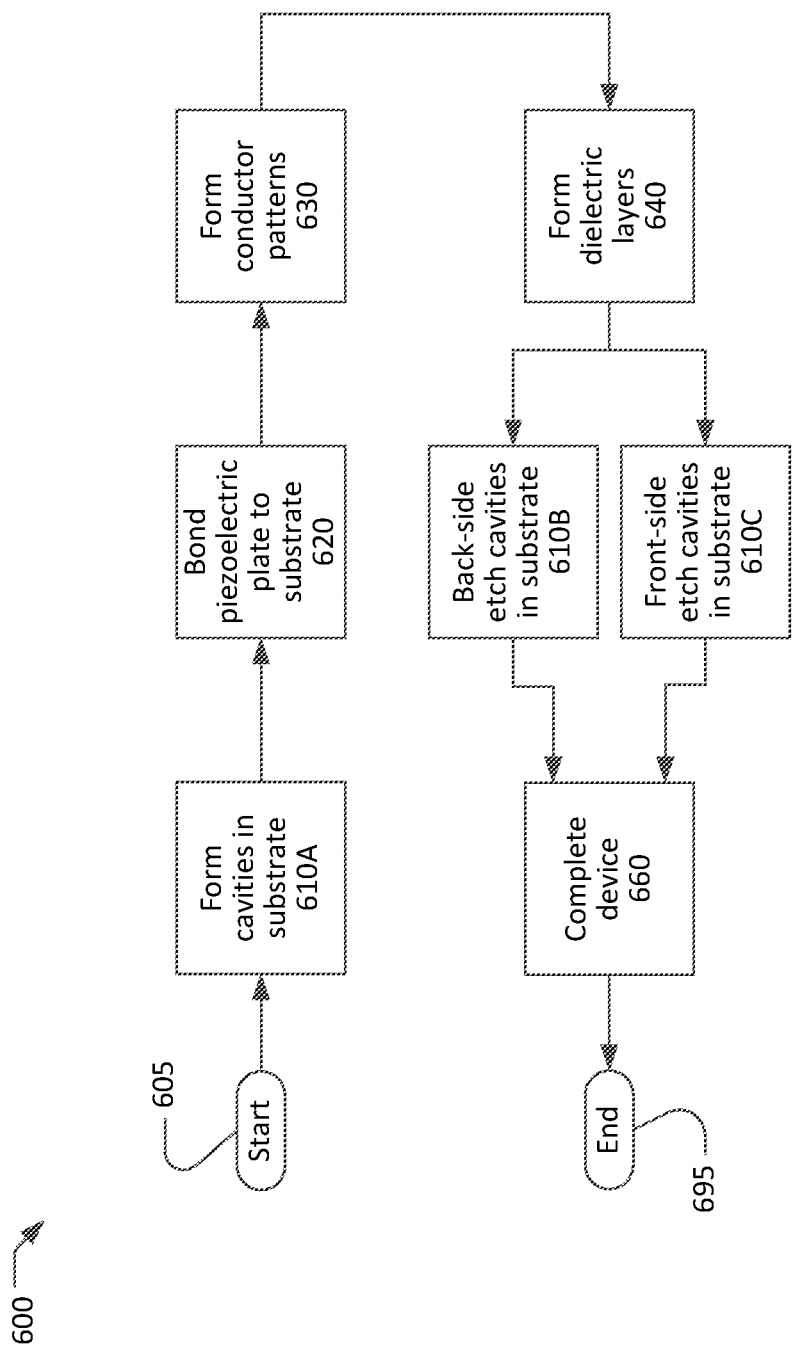
FIG. 6 is a flow chart of a conventional process for fabricating an XBAR.

FIG. 6 is a simplified flow chart showing a process 600 for making an XBAR or a filter incorporating XBARs. The process 600 may form XBAR 400, XBAR 450 or an example of that XBAR. The process 600 starts at 605 with a substrate and a plate of piezoelectric material and ends at 695 with a completed XBAR or filter. As will be described subsequently, the piezoelectric plate may be mounted on a sacrificial substrate or may be a portion of wafer of piezoelectric material. The flow chart of FIG. 6 includes only major process steps. Various conventional process steps (e.g. surface preparation, chemical mechanical processing (CMP), cleaning, inspection, deposition, photolithography, baking, annealing, monitoring, testing, etc.) may be performed before, between, after, and during the steps shown in FIG. 6.

The flow chart of FIG. 6 captures three variations of the process 600 for making an XBAR which differ in when and how cavities are formed in the substrate. The cavities may be formed at steps 610A, 610B, or 610C. Only one of these steps is performed in each of the three variations of the process 600.

The piezoelectric plate may be, for example, Z-cut, rotated Z-cut, or rotated Y-cut lithium niobate or lithium tantalate. In some cases, it is Y-cut or rotated Y-cut lithium niobate. The piezoelectric plate may be some other material and/or some other cut. The substrate may be silicon. The substrate or an intermediary layer of the substrate may be some material that allows formation of deep cavities by etching or other processing. The silicon substrate may have layers of silicon TOX and polycrystalline silicon.

In one variation of the process 600, at 610A one or more cavities are formed in the substrate 120 or 320; or an intermediary layer of the substrate, before the piezoelectric plate is bonded to the substrate at 620. A separate cavity may be formed for each resonator in a filter device. The one or more cavities may be formed using conventional photolithographic and etching techniques. These techniques may be isotropic or anisotropic; and may use deep reactive ion etching (DRIE). Typically, the cavities formed at 610A will not penetrate through the substrate or layer 322, and the resulting resonator devices will have a cross-section as shown in FIG. 3A.

At 620, the piezoelectric plate is bonded to the substrate. The piezoelectric plate and the substrate may be bonded by a wafer bonding process. Typically, the mating surfaces of the substrate and the piezoelectric plate are highly polished. One or more layers of intermediate materials, such as an oxide or metal, may be formed or deposited on the mating surface of one or both of the piezoelectric plate and the substrate. One or both mating surfaces may be activated using, for example, a plasma process. The mating surfaces may then be pressed together with considerable force to establish molecular bonds between the piezoelectric plate and the substrate or intermediate material layers.

In a first variation of 620, the piezoelectric plate is initially mounted on a sacrificial substrate. After the piezoelectric plate and the substrate are bonded, the sacrificial substrate, and any intervening layers, are removed to expose the surface of the piezoelectric plate (the surface that previously faced the sacrificial substrate). The sacrificial substrate may be removed, for example, by material-dependent wet or dry etching or some other process.

In a second variation of 620 starts with a single-crystal piezoelectric wafer. Ions are implanted to a controlled depth beneath a surface of the piezoelectric wafer (not shown in FIG. 6). The portion of the wafer from the surface to the depth of the ion implantation is (or will become) the thin piezoelectric plate and the balance of the wafer is effectively the sacrificial substrate. After the implanted surface of the piezoelectric wafer and device substrate are bonded, the piezoelectric wafer may be split at the plane of the implanted ions (for example, using thermal shock), leaving a thin plate of piezoelectric material exposed and bonded to the substrate. The thickness of the thin plate piezoelectric material is determined by the energy (and thus depth) of the implanted ions. The process of ion implantation and subsequent separation of a thin plate is commonly referred to as "ion slicing". The exposed surface of the thin piezoelectric plate may be polished or planarized after the piezoelectric wafer is split.

Conductor patterns and dielectric layers defining one or more XBAR devices are formed on the surface of the piezoelectric plate at 630. Typically, a filter device will have two or more conductor layers that are sequentially deposited and patterned. The conductor layers may include bonding pads, gold or solder bumps, or other means for making connection between the device and external circuitry. The conductor layers may be, for example, aluminum, an aluminum alloy, copper, a copper alloy, molybdenum, tungsten, beryllium, gold, or some other conductive metal. Optionally, one or more layers of other materials may be disposed below (i.e. between the conductor layer and the piezoelectric plate) and/or on top of the conductor layer. For example, a thin film of titanium, chrome, or other metal may be used to improve the adhesion between the conductor layers and the piezoelectric plate. The conductor layers may include bonding pads, gold or solder bumps, or other means for making connection between the device and external circuitry.

Conductor patterns may be formed at 630 by depositing the conductor layers over the surface of the piezoelectric plate and removing excess metal by etching through patterned photoresist. Alternatively, the conductor patterns may be formed at 630 using a lift-off process. Photoresist may be deposited over the piezoelectric plate and patterned to define the conductor pattern. The conductor layer may be deposited in sequence over the surface of the piezoelectric plate. The photoresist may then be removed, which removes the excess material, leaving the conductor pattern. In some cases, forming at 630 occurs prior to bonding at 620, such as where the IDT's are formed prior to bonding the plate to the substrate.

Forming conductor patterns at 630 may include forming the IDT 130 having gap shapes 438 or 488. The IDT 130 may have gaps that have circular gap shapes 438 having areas between circular shaped ends 442 of the interleaved fingers and larger circular shaped inner surfaces 443 of the opposing busbars; or gaps that have parabolic gap shapes 488 having areas between circular shaped ends 442 of the interleaved fingers and parabolic shaped inner surfaces 493 of the opposing busbars.

At 640, a front-side dielectric layer or layers may be formed by depositing one or more layers of dielectric material on the front side of the piezoelectric plate, over one or more desired conductor patterns of IDT or XBAR devices. The one or more dielectric layers may be deposited using a conventional deposition technique such as sputtering, evaporation, or chemical vapor deposition. The one or more dielectric layers may be deposited over the entire surface of the piezoelectric plate, including on top of the conductor pattern. Alternatively, one or more lithography processes (using photomasks) may be used to limit the deposition of the dielectric layers to selected areas of the piezoelectric plate, such as only between the interleaved fingers of the IDTs. Masks may also be used to allow deposition of different thicknesses of dielectric materials on different portions of the piezoelectric plate. In some cases, depositing at 640 includes depositing a first thickness of at least one dielectric layer over the front-side surface of selected IDTs, but no dielectric or a second thickness less than the first thickness of at least one dielectric over the other IDTs. An alternative is where these dielectric layers are only between the interleaved fingers of the IDTs.

The one or more dielectric layers may include, for example, a dielectric layer selectively formed over the IDTs of shunt resonators to shift the resonance frequency of the shunt resonators relative to the resonance frequency of series resonators as described in U.S. Pat. No. 10,491,192. The one or more dielectric layers may include an encapsulation/passivation layer deposited over all or a substantial portion of the device.

The different thickness of these dielectric layers causes the selected XBARs to be tuned to different frequencies as compared to the other XBARs. For example, the resonance frequencies of the XBARs in a filter may be tuned using different front-side dielectric layer thickness on some XBARs.

As compared to the admittance of an XBAR with tfd=0 (i.e. an XBAR without dielectric layers), the admittance of an XBAR with tfd=30 nm dielectric layer reduces the resonant frequency by about 145 MHz compared to the XBAR without dielectric layers. The admittance of an XBAR with tfd=60 nm dielectric layer reduces the resonant frequency by about 305 MHz compared to the XBAR without dielectric layers. The admittance of an XBAR with tfd=90 nm dielectric layer reduces the resonant frequency by about 475 MHz compared to the XBAR without dielectric layers. Importantly, the presence of the dielectric layers of various thicknesses has little or no effect on the piezoelectric coupling.

In a second variation of the process 600, one or more cavities are formed in the back side of the substrate at 610B after all the conductor patterns and dielectric layers are formed at 630. A separate cavity may be formed for each resonator in a filter device. The one or more cavities may be formed using an anisotropic or orientation-dependent dry or wet etch to open holes through the back-side of the substrate to the piezoelectric plate. In this case, the resulting resonator devices will have a cross-section as shown in FIG. 1.

In a third variation of the process 600, one or more cavities in the form of recesses in the substrate or top layer 322 may be formed at 610C by etching a sacrificial layer formed in the front side of the substrate using an etchant introduced through openings in the piezoelectric plate. A separate cavity may be formed for each resonator in a filter device. The one or more cavities may be formed using an isotropic or orientation-independent dry etch that passes through holes in the piezoelectric plate and etches the sacrificial layer formed in recesses in the front-side of the substrate. The one or more cavities formed at 610C will not penetrate completely through the substrate top layer 322, and the resulting resonator devices will have a cross-section as shown in FIG. 3A.

In all variations of the process 600, the filter or XBAR device is completed at 660. Actions that may occur at 660 include depositing an encapsulation/passivation layer such as $SiO_2$ or $Si_3O_4$ over all or a portion of the device; forming bonding pads or solder bumps or other means for making connection between the device and external circuitry; excising individual devices from a wafer containing multiple devices; other packaging steps; and testing. Another action that may occur at 660 is to tune the resonant frequencies of the resonators within a filter device by adding or removing metal or dielectric material from the front side of the device. After the filter device is completed, the process ends at 695. FIGS. 1-4 may show examples of the fingers of selected IDTs after completion at 660.

Forming the cavities at 610A may require the fewest total process steps but has the disadvantage that the XBAR diaphragms will be unsupported during all of the subsequent process steps. This may lead to damage to, or unacceptable distortion of, the diaphragms during subsequent processing.

Forming the cavities using a back-side etch at 610B requires additional handling inherent in two-sided wafer processing. Forming the cavities from the back side also greatly complicates packaging the XBAR devices since both the front side and the back side of the device must be sealed by the package.

Forming the cavities by etching from the front side at 610C does not require two-sided wafer processing and has the advantage that the XBAR diaphragms are supported during all of the preceding process steps. However, an etching process capable of forming the cavities through openings in the piezoelectric plate will necessarily be isotropic. However, as illustrated in FIG. 3A, such an etching process using a sacrificial material allows for a controlled etching of the cavity, both laterally (i.e. parallel to the surface of the substrate) as well as normal to the surface of the substrate.

In some cases, the XBAR 400 has the ends of IDT interleaved fingers 136 and 436 having a curved shape; or inner surfaces of the opposing busbars 132 and 134 having a curved shape. In some cases, it has both the ends and the inner surfaces having curved shapes. In this case, the curved shape(s) replace the semicircular ends 442 of the fingers 136 and/or the semicircular inner surface 443 of the bus bar 132, The curved shape may be one of a corner-less shape, a non-rectangular shape, a continuously curved shape, a continuously convex shape, an elliptical shape, a rectangle with at least one-rounded corner shape, or a concave shape.

Having ends of IDT interleaved fingers 136 and 436 having a curved shape; and/or inner surfaces of the opposing busbars 132 and 134 having a curved shape causes (a) an oblique excitation has the same wavevector as the longitudinal XBAR mode; and/or shapes that (b) results in reflection of the oblique excitation into a transverse standing wave.

Figure 7:
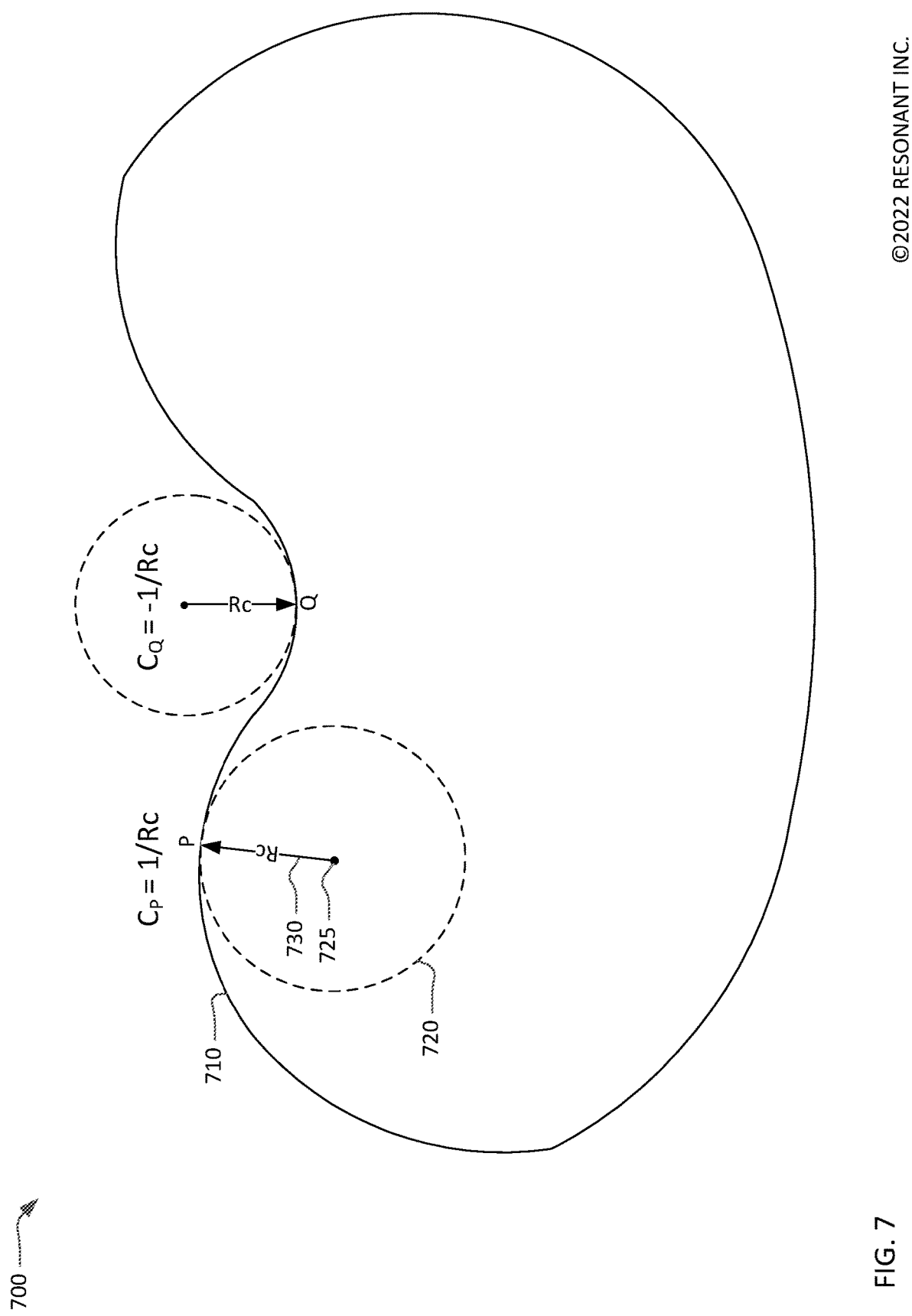
FIG. 7 is a graphic that illustrates the definition of the curvature of a line or a curved shape.

FIG. 7 is a graphic that illustrates the definition of the curvature of a line or a curved shape. The line 710 is a two-dimensional closed curved line having an arbitrary shape. The circle 720 is the so-called "osculating circle", which is the circle that best approximates the curve 710 at a point P. More precisely, given a point P on the curve 710, every other point X (not shown) of the curve 710 defines a circle (or sometimes a line) passing through X and tangent to the curve at P. The osculating circle is the limit, if it exists, of this circle when X closely approaches P. Radial line 730 joins point P to the center 725 of the osculating circle 720. The length Re of the radial line 730 is the "radius of curvature" of the curve 710 at the point P. The curvature $C_P$ at the point P is the reciprocal of Rc. The curvature at a point on the perimeter of a cavity is positive if the radial line joining the point and the center of the corresponding osculating circle is within or crosses the cavity. Conversely, the curvature at a point on the perimeter of a cavity is negative if the radial line joining the point and the center of the corresponding osculating circle is outside of the cavity. For example, the curvature of the line 710 at point Q is negative.

Since the radius of curvature of a straight line is infinite, the curvature of a straight line is zero. Conversely, since the radius of a sharp corner (for example a corner formed by the intersection of two lines) is zero, the curvature of such a corner is infinite.

In this patent, the perimeter of a cavity is "curved" if the curvature for at least one point on the perimeter is non-zero and finite. The perimeter 145 of the cavity 140 in FIG. 1 is not curved. The curvature of the perimeter 145 is zero along the straight top, bottom, left, and right (as seen in the figure) sides of the cavity and infinite in the corners where the sides intersect. At no point on the perimeter 145 is the curvature both non-zero and finite. This will be true of any perimeter having only straight sides.

The perimeter of a cavity is "continuously curved" if the curvature is non-zero and finite at every point along the perimeter. The perimeter of a cavity is "corner-less" if the curvature is finite at all points along the perimeter.

A portion of the perimeter having positive curvature is "convex", and a portion of the perimeter having negative curvature is "concave". The perimeter of a cavity is continuously convex if the curvature at every point on the perimeter is finite and greater than zero. The perimeter of the cavity is "non-concave" if the curvature at every point on the perimeter is finite and greater than or equal to zero.

An "elliptical" shape is curved, corner-less, continuously curved, and non-concave as those terms were previously defined.

Closing Comments

Throughout this description, the embodiments and examples shown should be considered as exemplars, rather than limitations on the apparatus and procedures disclosed or claimed. Although many of the examples presented herein involve specific combinations of method acts or system elements, it should be understood that those acts and those elements may be combined in other ways to accomplish the same objectives. With regard to flowcharts, additional and fewer steps may be taken, and the steps as shown may be combined or further refined to achieve the methods described herein. Acts, elements and features discussed only in connection with one embodiment are not intended to be excluded from a similar role in other embodiments.

As used herein, "plurality" means two or more. As used herein, a "set" of items may include one or more of such items. As used herein, whether in the written description or the claims, the terms "comprising", "including", "carrying", "having", "containing", "involving", and the like are to be understood to be open-ended, i.e., to mean including but not limited to. Only the transitional phrases "consisting of" and "consisting essentially of", respectively, are closed or semi-closed transitional phrases with respect to claims. Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements. As used herein, "and/or" means that the listed items are alternatives, but the alternatives also include any combination of the listed items.

It is claimed:

1. An acoustic resonator device comprising:
    a substrate having a surface;
    a piezoelectric plate that includes a portion that forms a diaphragm that is over a cavity; and
    an interdigital transducer (IDT) on a surface of the piezoelectric plate, the IDT including opposing busbars that have interleaved fingers extending therefrom that are on the diaphragm,
    wherein inner surfaces of the opposing busbars of the IDT have a curved shape.

2. The acoustic resonator device of claim 1, wherein the curved shape is one of a corner-less shape, a non-rectangular shape, a continuously curved shape, a continuously convex shape, an elliptical shape a rectangle with at least one-rounded corner shape, or a concave shape.

3. The acoustic resonator device of claim 2, wherein both ends of interleaved fingers and the inner surfaces of the opposing busbars have the curved shape.

4. The acoustic resonator device of claim 1, wherein gaps between ends of the interleaved fingers and the inner surfaces of the opposing busbars have one of circular gap shapes or parabolic gap shapes.

5. The acoustic resonator device of claim 4, wherein the gaps are circular gap shapes having areas between circular shaped ends of the interleaved fingers and larger circular shaped inner surfaces of the opposing busbars.

6. The acoustic resonator device of claim 5, wherein the circular shaped ends of the interleaved fingers and the circular shaped inner surfaces of the opposing busbars are circles with different radii and a common center point.

7. The acoustic resonator device of claim 4, wherein the gaps are parabolic gap shapes having areas between circular shaped ends of the interleaved fingers and parabolic shaped inner surfaces of the opposing busbars.

8. The acoustic resonator device of claim 7, wherein the circular shaped ends of the interleaved fingers have a center and a radius, and wherein the parabolic shaped ends of the opposing busbars have a focus at the center and a focal length that is greater than the radius.

9. The acoustic resonator device of claim 4, wherein one of:
    the gaps are circular gap shapes such that (a) an oblique excitation has a same wavevector as a longitudinal shear acoustic mode; or
    the gaps are parabolic gap shapes that (b) results in reflection of an oblique excitation into a transverse standing wave.

10. The acoustic resonator device of claim 1, wherein:
    an IDT pitch is a center-to-center spacing between adjacent fingers of the interleaved fingers,
    a first plurality of the interleaved fingers is attached to a first busbar is interleaved with a second plurality of the interleaved fingers, and
    the second plurality of the interleaved fingers is attached to a second busbar that opposes the first busbar.

11. The acoustic resonator device of claim 1, wherein:
    a radio frequency signal applied to the IDT excites a primary shear acoustic mode in the piezoelectric plate over the cavity, and the cavity is in an intermediate layer of the substrate, and
    the piezoelectric plate is a Z-cut lithium niobate or lithium tantalate piezoelectric material.

12. An acoustic resonator device comprising:
    a substrate having a surface;
    a piezoelectric plate having front and back surfaces, the back surface attached to the surface of the substrate, except for a portion of the piezoelectric plate forming a diaphragm that is over a cavity; and
    a conductor pattern including an interdigital transducer (IDT) on the front surface of the piezoelectric plate, such that interleaved fingers of the IDT are on the diaphragm,
    wherein the IDT includes a first set of the interleaved fingers attached to and extending from a first busbar, and a second set of the interleaved fingers attached to and extending from a second busbar,
    wherein gaps between ends of the set of first interleaved fingers and the second busbar have one of circular gap shapes or parabolic gap shapes,
    gaps between ends of the set of second interleaved fingers and the first busbar have one of circular gap shapes or parabolic gap shapes, and
    wherein an inner surface of the first busbar has a curved shaped.

13. The acoustic resonator device of claim 12, wherein the gaps between the ends of the set of first interleaved fingers and the second busbar are circular gap shapes having areas between circular shaped respective ends of the interleaved fingers and larger circular shaped inner surfaces of the respective first and second busbars, and the circular shaped ends of the interleaved fingers and the circular shaped inner surfaces of the first and second busbars are circles with different radii and a common center point.

14. The acoustic resonator device of claim 12, wherein the gaps between the ends of the set of first interleaved fingers and the second busbar are parabolic gap shapes having areas between circular shaped ends of the interleaved fingers and parabolic shaped inner surfaces of the respective first and second busbars, the circular shaped ends of the interleaved fingers have a center and a radius, and the parabolic shaped ends of the first and second busbars have a focus at the center and a focal length that is greater than the radius.

15. The acoustic resonator device of claim 12, wherein:
a radio frequency signal applied to the IDT excites a primary shear acoustic mode in the piezoelectric plate over the cavity,
the cavity is in an intermediate layer of the substrate, and
the piezoelectric plate is a Z-cut lithium niobate or lithium tantalate piezoelectric material.

16. An acoustic resonator device with circular or parabolic gap shapes between ends of interdigital transducer (IDT) fingers and first and second busbars, the device comprising:
a piezoelectric plate and
an interdigital transducer (IDT) having interleaved fingers on a surface of the piezoelectric plate,
wherein the interleaved fingers of the IDT include a first plurality of fingers extending from the first busbar and a second plurality of fingers extending from the second busbar,
wherein a distance between adjacent fingers of the interleaved fingers defines an IDT pitch,
wherein gaps between respective ends of the first plurality of fingers and the second busbar are one of circular gap shapes or parabolic gap shapes,
wherein gaps between respective ends of the second plurality of fingers and the first busbar are one of circular gap shapes or parabolic gap shapes, and
wherein an inner surface of the first busbar that faces the second busbar has a curved shaped.

17. The acoustic resonator device of claim 16,
wherein the IDT includes a gap distance gd between the respective ends of the first plurality of fingers and the second busbar, and between the respective ends of the second plurality of fingers and the first busbar; and
wherein the gap distance gd is the IDT pitch minus a width of at least one fingers the interleaved fingers of the IDT.

18. The acoustic resonator device of claim 16, wherein the IDT pitch is a center-to-center spacing between the adjacent fingers of the interleaved fingers, and the first and second plurality of fingers are attached to the first and second busbars, respectively.

19. The acoustic resonator device of claim 16, wherein:
a radio frequency signal applied to the IDT excites a primary shear acoustic mode in the piezoelectric plate,
the piezoelectric plate includes a diaphragm that is over a cavity in an intermediate layer of a substrate, and
the piezoelectric plate is a Z-cut lithium niobate or lithium tantalate piezoelectric material.

20. The acoustic resonator device of claim 16, wherein one of:
the gaps between the ends of the first plurality of fingers and the second busbar are circular gap shapes having areas between circular shaped ends of the interleaved fingers and larger circular shaped inner surfaces of the respective first and second busbars; or
the gaps between the ends of the first plurality of fingers and the second busbar are parabolic gap shapes having areas between circular shaped ends of the interleaved fingers and parabolic shaped inner surfaces of the respective first and second busbars.

* * * * *